(12) United States Patent
Matsubara et al.

(10) Patent No.: US 8,110,858 B2
(45) Date of Patent: Feb. 7, 2012

(54) THIN FILM TRANSISTOR ARRAY, METHOD FOR MANUFACTURING THE SAME, AND ACTIVE MATRIX TYPE DISPLAY USING THE SAME

(75) Inventors: Ryohei Matsubara, Tokyo (JP); Mamoru Ishizaki, Tokyo (JP)

(73) Assignee: Toppan Printing Co., Ltd. (JP)

( * ) Notice: Subject to any disclaimer, the term of this patent is extended or adjusted under 35 U.S.C. 154(b) by 437 days.

(21) Appl. No.: 12/028,764

(22) Filed: Feb. 8, 2008

(65) Prior Publication Data
US 2008/0197348 A1    Aug. 21, 2008

(30) Foreign Application Priority Data
Feb. 21, 2007    (JP) .................................. 2007-041508

(51) Int. Cl.
*H01L 51/50*    (2006.01)
(52) U.S. Cl. ............................ 257/288; 257/287; 438/34
(58) Field of Classification Search .................. 257/288, 257/40, E51.018, 287
See application file for complete search history.

(56) References Cited

U.S. PATENT DOCUMENTS

| 7,068,418 | B2 * | 6/2006 | Kawase | 359/296 |
| 7,342,288 | B2 * | 3/2008 | Fujii et al. | 257/401 |
| 2004/0235227 | A1 * | 11/2004 | Kawase | 438/158 |
| 2005/0110924 | A1 * | 5/2005 | Kim et al. | 349/111 |
| 2005/0151195 | A1 * | 7/2005 | Kawase et al. | 257/347 |
| 2005/0162366 | A1 * | 7/2005 | Moriya et al. | 345/97 |
| 2006/0249817 | A1 * | 11/2006 | Kawase et al. | 257/622 |

FOREIGN PATENT DOCUMENTS

| JP | 02275672 A | * 11/1990 |
| JP | 2004-080026 | 3/2004 |
| JP | 2005-210086 | 8/2005 |
| JP | 2006-063334 | 3/2006 |

OTHER PUBLICATIONS

Garnier, Francis et al., "All-Polymer Field-Effect Transistor Realized by Printing Techniques", *Science*, Sep. 16, 1994, pp. 1684-1686.

* cited by examiner

*Primary Examiner* — Ha Tran T Nguyen
*Assistant Examiner* — Jordan Klein
(74) *Attorney, Agent, or Firm* — Squire, Sanders & Dempsey (US) LLP

(57) ABSTRACT

One embodiment of the present invention is a thin film transistor array, having an insulating substrate and a stripe-shaped semiconductor layer for a plurality of transistors, the layer extending over the plurality of transistors. Another embodiment of the present invention is an active matrix type display, having the thin film transistor array of the one embodiment and an image display means.

17 Claims, 24 Drawing Sheets

THIN FILM TRANSISTOR ARRAY, METHOD FOR MANUFACTURING THE SAME, AND ACTIVE MATRIX TYPE DISPLAY USING THE SAME

CROSS REFERENCE

This application claims priority to Japanese application number 2007-041508, filed on Feb. 21, 2007, which is incorporated by reference.

BACKGROUND OF THE INVENTION

1. Field of the Invention

The present invention is related to a thin film transistor array, method for manufacturing the thin film transistor array, and an active matrix type display using the thin film transistor array.

2. Description of the Related Art

According to a remarkable development of the information technology, now, information is frequently sent or received using a mobile information terminal, a notebook computer and the like. It is well-known that, in near future, the ubiquitous society will be realized so that information is sent or received at any place. In such a society, an information terminal of thinner and lighter is desired.

Now, main stream of the semiconductor material is silicon type (Si type). However, the research and development of the transistor using an organic semiconductor (the organic transistor) have become active in views of improving the flexibility, reducing the weight and reducing the cost. In the case of the organic semiconductor, process in wet state can be generally adopted. Therefore, there are some advantages of the organic semiconductor. For example, increasing the size is possible, a printing method can be adopted and a plastic substrate can be used. (See non-patent document 1.)

In addition, the application field of the organic semiconductor is wide, and is not limited to the above-mentioned the thin and light flexible display. The application of the organic semiconductor to RFID (radio frequency identification) tag or a sensor is expected. In this way, for the ubiquitous society, the research and development of the organic transistor is necessary.

From these reasons, now, the research and development of the organic semiconductor using a printing method gather attention.

A spin coat method, a dip coat method, an ink jet method and the like are used for forming a semiconductor layer from a solution. In a transistor array having a plurality of arranged transistors which are manufactured by the spin coat method or the dip coat method among the above-mentioned methods, electric current easily flows through a semiconductor layer between transistor devices or between a transistor and a pixel electrode. Therefore, electric current (leak current) value at the off state becomes large, thereby on/off ratio becomes lowered.

Therefore, for example, in patent document 1, transistor devices are separated by forming a semiconductor layer by an ink jet method. In addition, for example, in patent document 2, transistor devices are separated by injecting a semiconductor solution in a channel part between a source electrode and a drain electrode.

In addition, for example, in patent document 3, a pattern is formed using an organic semiconductor solution by flexo printing.

[non-patent document 1] Science Vol. 265, 1684 (1994)
[patent document 1] JP-A-2005-210086
[patent document 2] JP-A-2004-80026
[patent document 3] JP-A-2006-63334

SUMMARY OF THE INVENTION

In the ink jet method, since an organic semiconductor is generally difficult to be dissolved in a solvent, an organic semiconductor is frequently separated out in a part near a nozzle. This causes a failure to eject an ink.

On the other hand, in a method where a semiconductor solution is injected in a channel part, there is a problem that the throughput is low.

In addition, in a case where separated devices are formed by the flexo printing, it is necessary to print independent patterns. However, when an organic semiconductor solution is transferred from an anilox to a flexo plate, an amount of the transferred solution differs according to a situation where a convex part of the flexo plate puts into a concave part of the anilox or the convex part touches a convex part of the anilox. Therefore, fluctuation of the film thickness of the formed film occurs. The fluctuation of the film thickness causes fluctuation of the thin film transistor properties.

The realization of a thin film transistor array having a high throughput, a high alignment accuracy, a high on/off ratio and a small fluctuation between devices was studied. In the study, it was found that a thin film transistor array satisfying the above-mentioned properties and a method for manufacturing the thin film transistor are realized by optimizing the arrangement of a thin film transistor array so that stripe shaped organic semiconductor layers is formed and by forming stripe shaped organic semiconductor layers.

In these drawings, 10 is a substrate; 11 is a gate insulator; 12 is a semiconductor layer; 13 is a sealing (encapsulation) layer; 14 is an interlayer dielectric; 21 is a gate electrode; 22 is a gate wire; 23 is a capacitor electrode; 24 is a capacitor wire; 25 is a pixel electrode; 26 is a drain electrode; 27 is a source electrode; 28 is a source wire; 28' is a second source wire; 29 is an upper pixel electrode, 30 is a polarizing plate; 31 is a glass substrate; 32 is a orientation film; 33 is a liquid crystal; 34 is a spacer; 35 is a common electrode; 36 is a color filter (color part); 37 is a color filter (black matrix); 38 is a protective layer; G1 is a first gate electrode; G2 is a second gate electrode; C is a capacitor electrode; GI1 is a first gate insulator; GI2 is a second gate insulator; S1 is a first source electrode; S2 is a second source electrode; D1 is a first drain electrode; D2 is a second drain electrode; OSC1 is a first organic semiconductor layer; OSC2 is a second organic semiconductor layer; F1 is a first sealing (encapsulation) layer; F2 is a second sealing (encapsulation) layer; 41 is a hole transport layer; 42 is a light emitting layer; and 43 is a common electrode.

DESCRIPTION OF THE PREFERRED EMBODIMENTS

In an embodiment of the present invention, it is desirable that a semiconductor layer 12 be stripe-shaped extending over a plurality of thin film transistors. In such a case, thin film transistors can be manufactured while the throughput is high and the alignment accuracy is high. Further, thin film transistors can be manufactured, wherein difference (fluctuation) between transistor devices is small and on/off ratio is high.

In addition, for example, in the case of manufacturing a bottom contact type device, when dot-shaped semiconductor layer 12 is formed by a wet process, if an electrode surface has a higher affinity for a solution than an insulator surface, semiconductor layer 12 at a channel part is pulled to an electrode part or a wiring. This causes a problem in which a good channel part can not be formed. Then, if semiconductor layer 12 is stripe-shaped, an amount of a semiconductor solution is increased. Therefore, a channel part is more successfully formed. In addition, in view of adhesiveness of semiconductor layer 12, adhesiveness of stripe-shaped semiconductor layer 12 is stronger than adhesiveness of dot-shaped semiconductor layer 12, since stripe-shaped semiconductor layer 12 has a larger contact area with a substrate.

Figure 1:
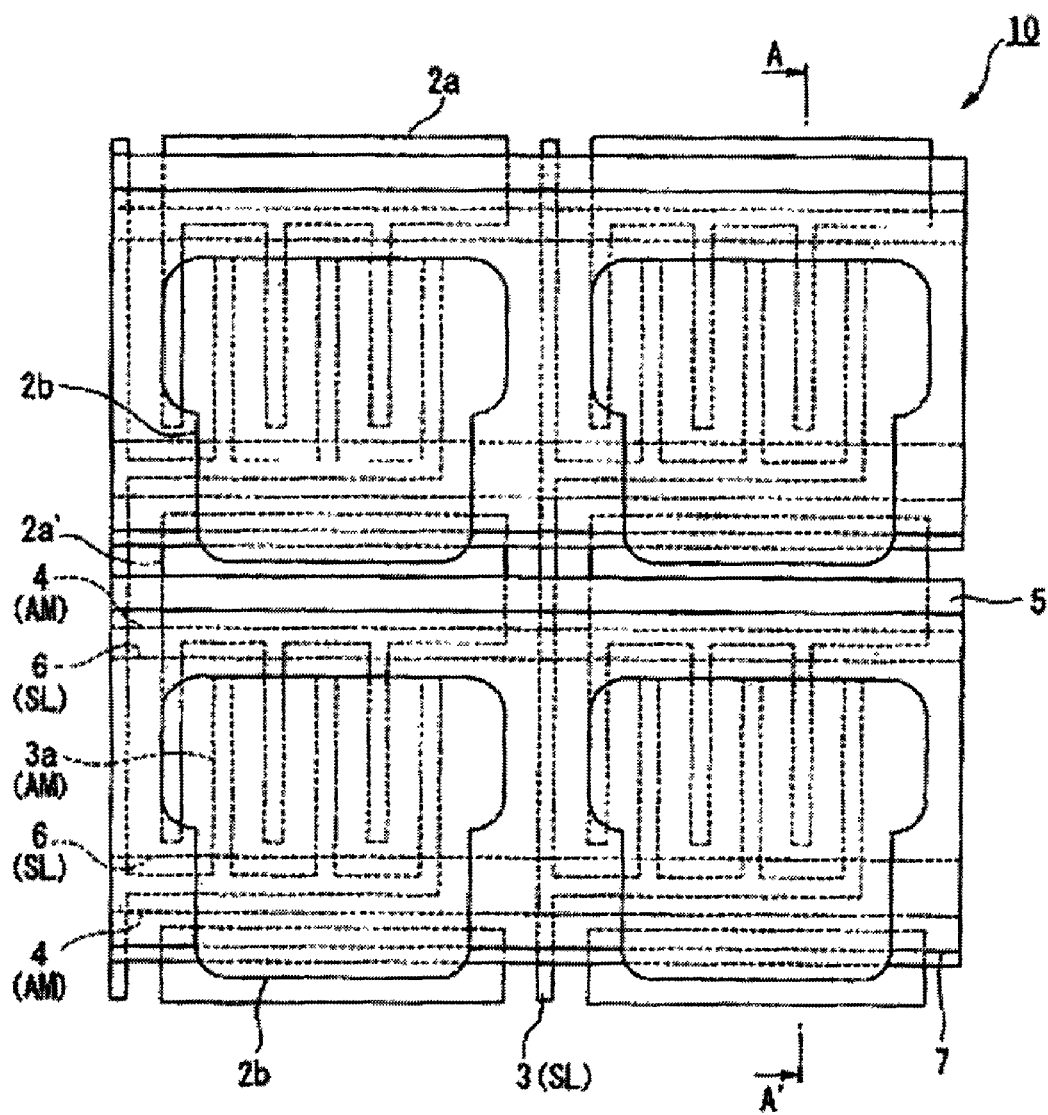
FIG. 1 is a schematic diagram of a thin film transistor array showing an embodiment of the present invention (bottom gate/bottom contact type).
Figure 5:
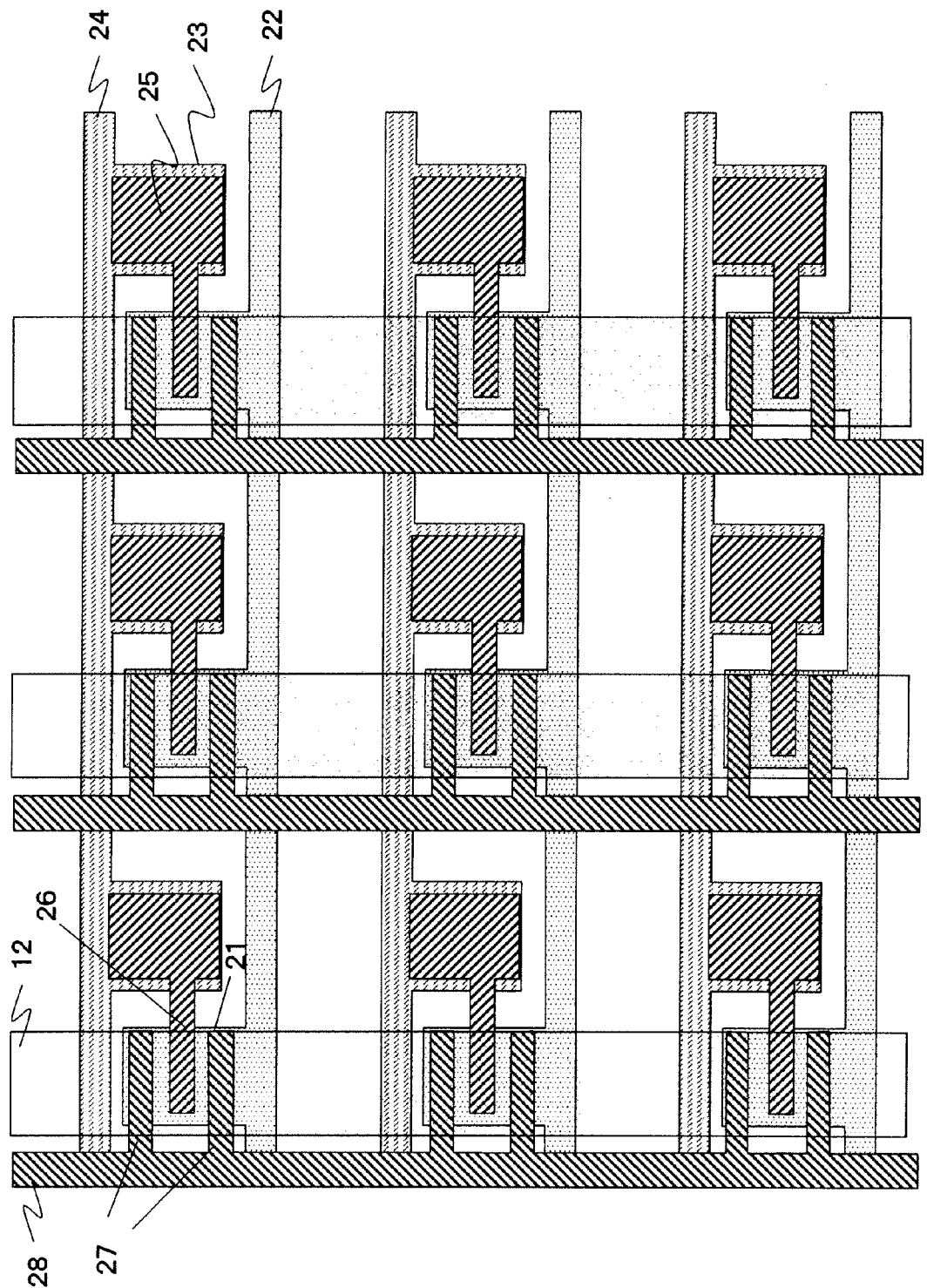
FIG. 5 is an exemplary diagram of a thin film transistor array showing an embodiment of the present invention (bottom gate/bottom contact type).
Figure 8:
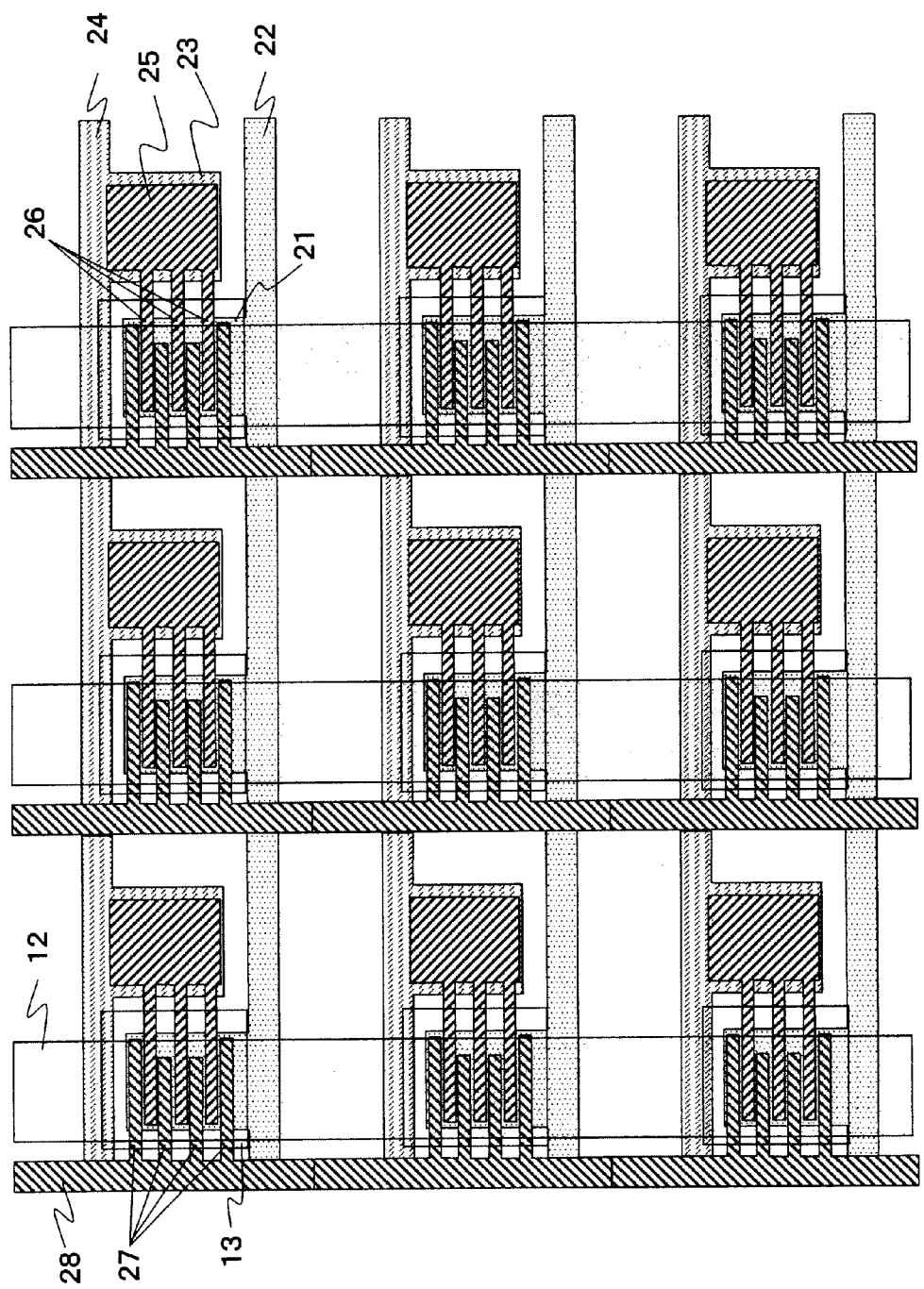
FIG. 8 is an exemplary diagram of a thin film transistor array (bottom gate/bottom contact type) of the present invention, wherein a comb-tooth in most outer part of a source electrode is longer than the other comb-teeth of a source electrode.

In an embodiment of the present invention, it is desirable that the direction of the stripe shape of the semiconductor layer 12 is same as the direction of the source wire 28 as shown in FIGS. 1, 5 and 8. In such a case, there is a following advantage: the voltages of the source electrodes 27 of the thin film transistor are same, wherein the source electrodes 27 are neighboring in the direction of the source wire 28; thereby, even if the semiconductor layer 12 is extending over neighboring thin film transistors, electric current does not flow between the thin film transistors through the semiconductor layer 12; therefore, leak current (off current) can be kept to be small.

In an embodiment of the present invention, it is desirable that a semiconductor layer 12 be an organic semiconductor. Since an organic semiconductor can be dissolved by some organic solvents, the semiconductor layer 12 can be formed by a printing method. However, a semiconductor material can be dispersed as particles, without dissolved in a solvent. The semiconductor layer 12 can be formed by drying or baking the dispersed solution after printing the dispersed solution.

In an embodiment of the present invention, it is desirable that a pixel electrode 25 be out of contact with a semiconductor layer 12. In the case where the semiconductor layer 12 is in contact with a pixel electrode 25, even if the state is off, electric current flows between a source electrode 27 and a pixel electrode 25 and on/off ratio becomes small.

In an embodiment of the present invention, it is desirable that a semiconductor layer 12 be not in contact with a portion in which a drain electrode 26 and a pixel electrode 25 does not respectively overlap a gate electrode 21 and a capacitor electrode 23. If there is a semiconductor layer 12 in the portion, the control of electric current becomes impossible, wherein the electric current flows at the off state. This causes the reduction of on/off ratio.

Figure 17:
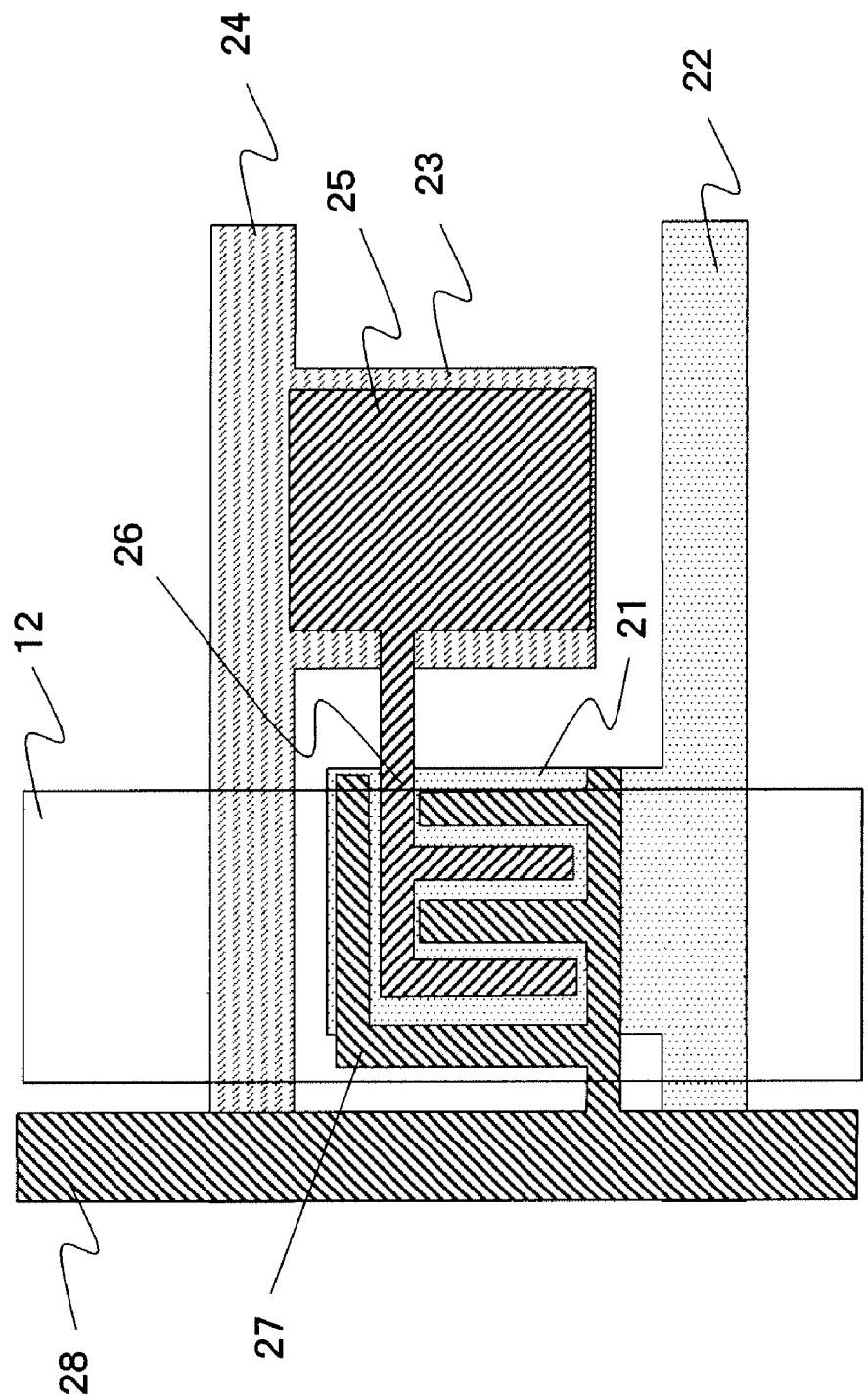
FIG. 17 is a schematic diagram of a thin film transistor array showing an embodiment of the present invention.

As for the shape of the source electrode 27/drain electrode 26 in an embodiment of the present invention, it is desirable that the comb-teeth shaped electrode as shown in FIGS. 2, 6, 9 and 12 be used in order to increase the effective channel width and the electric current in the case where an organic semiconductor having lower conductive properties compared to the amorphous silicon (a-Si) is used. However, it is not necessary that the direction of the comb-teeth is perpendicular to the direction of the source wire 28. The direction of the comb-teeth may be parallel to the direction of the source wire 28 as shown in FIG. 17. The shapes of the source/drain electrodes are not limited to these.

Figure 24:
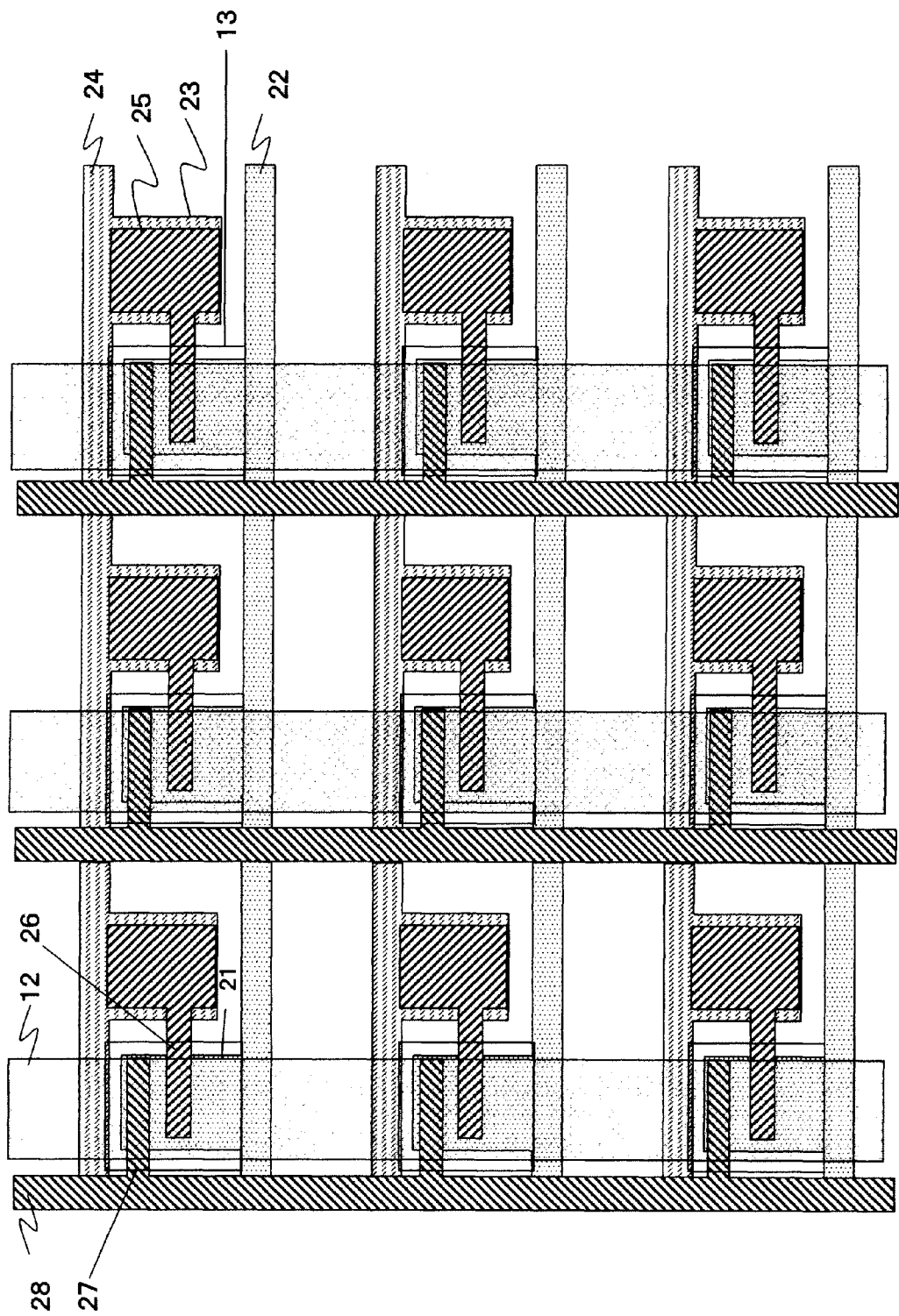
FIG. 24 is a schematic diagram of a thin film transistor array showing an embodiment of the present invention. (bottom gate/bottom contact type).

As other shapes, for example, shape shown in FIG. 24 (source electrode 27 and drain electrode 26 are not comb-teeth shaped) can be used. Further, corbino type can be preferably used.

In an embodiment of the present invention, it is desirable that the number of the comb-teeth of the source electrode 27 is more than the number of the comb-teeth of the drain electrode 26, as shown in FIGS. 2, 6, 9, 12 and 17. In the case where the number of the comb-teeth of the source electrode 27 is more than the number of the comb-teeth of the drain electrode 26, the parasitic capacitance can be preferably reduced compared to the case where the number of the comb-teeth of the source electrode 27 is equal to the number of the comb-teeth of the drain electrode 26. In addition, when the number of the teeth of the source electrode 27 is more than the number of the teeth of the drain electrode, since the voltages in most outside electrodes of the transistor region neighboring in the direction of the source wire 28 become same, the leak current can be reduced.

In an embodiment of the present invention, it is desirable that most outer source electrodes 27 in a respective pixel region including a thin film transistor intersects a stripe shaped semiconductor layer 12 as shown in FIGS. 2, 6, 9, 12 and 17. In the case where a source electrode 27 intersects the stripe shaped semiconductor layer 12 at the most outer side of each pixel region, thin film transistors of the respective pixel can be electrically independent and the off electrical current can be reduced, wherein the thin film transistors are neighboring in the direction of a source wire 28.

In an embodiment of the present invention, it is desirable that a flexible substrate 10 be used for a substrate 10 having insulating properties. Examples of generally used material include plastic materials such as polyethylene terephthalate (PET), polyimide, polyethersulfone (PES), polyethylenenaphthalate (PEN) and polycarbonate. A glass substrate 31 such as quartz, a silicon wafer and the like can be used for a substrate 10 having insulating properties. However, a plastic substrate 10 is preferable in view of making a device thin, light and flexible. It is desirable that PEN or polyimide be used for a substrate 10 in view of temperatures of respective manufacturing processes.

All structures, for example, bottom gate/bottom contact type, bottom gate/top contact type and top gate/bottom contact type can be used for the structure of a transistor of an embodiment of the present invention. There is not any special limit to the structure.

In an embodiment of the present invention, the width of a semiconductor layer 12 is not especially limited. However, it is desirable that the semiconductor layer 12 be located in the inner side of the end of a source electrode 27, wherein the end is one end of the source electrode 27 near a pixel electrode 25. In view of reducing the off current, as for the semiconductor layer 12, it is not desirable that the one end of the source electrode 27 near the pixel electrode 25 be beyond an end of a gate electrode 21. Further, it is not desirable that the semiconductor layer 12 be in contact with the pixel electrode 25. On the other hand, when the semiconductor layer 12 is beyond an end of a drain electrode 26 near a source wire 28, the off current is not influenced. Therefore, the semiconductor layer 12 may be beyond the end of the drain electrode 26 near the source wire 28.

In an embodiment of the present invention, a material used for an electrode material is not especially limited. However, examples of generally used materials include a thin film of a metal or an oxide such as gold, platinum, nickel and indium tin oxide, a solution in which a metal conductive polymer such as poly (ethylenedioxy thiophen)/polystyrene sulfonate (PEDOT/PSS) and polyaniline or a colloid particle such as gold, silver and nickel is dispersed, and a paste for forming a thick film using a metal particle such as a silver as a conductive material. In addition, a method for forming the electrode is not especially limited. The method may be a dry method such as evaporation coating or sputtering. However, in view of making the electrode flexible and inexpensive, it is desirable that the electrode be formed by wet methods such as a screen printing, a reverse type offset printing, a flexo printing and an ink jet method.

In an embodiment of the present invention, a material used for a gate insulator 11 is not especially limited. However, examples of generally used materials include polymer solutions such as polyvinylphenol, polymethyl methacrylate, polyimide, polyvinyl alcohol and epoxy resin, and solutions in which alumina or silica is dispersed. In addition, a thin film such as PET, PEN or PES can be used for a gate insulator 11.

In an embodiment of the present invention, a material used for a semiconductor layer 12 is not especially limited. Examples of generally used materials include polymer system organic semiconductor materials such as polythiophene, polyallylamine, fluorene BT [2,2'-bithiophene] copolymer and the derivatives thereof, and low molecular system organic semiconductor materials such as pentacene, tetracene, copper phthalocyanine, perylene and the derivatives thereof However, in view of making a device flexible and large-sized by low cost, it is desirable that an organic semiconductor material which can be applied to a printing method be used. In addition, carbon compounds such as carbon nano-tube and fullerene, and semiconductor nano particle dispersions can be also used as a semiconductor material. Well-known methods such as a gravure printing, an offset printing, a screen printing and an ink jet method can be used for a printing method for forming an organic semiconductor layer. In the case of the above-mentioned organic semiconductor materials, the solubility in a solvent is low. Therefore, it is desirable that a flexo printing, a reverse type offset printing, an ink jet method and a dispenser method, which are suitable for printing a low-viscosity solution, be used. Especially, a flexo printing is most preferable because, in a flexo printing, a printing time is short and an amount of an ink to be used is small. Further, a flexo printing is suitable for printing a stripe shaped pattern. When a semiconductor layer 12 is stripe shaped, a film thickness of a semiconductor layer 12 becomes uniform by a distribution of a film thickness fluctuation due to a convex and a concave of an anilox being averaged inside a shape of stripe. Therefore, the characteristics of TFTs can be uniform.

In an embodiment of the present invention, the kind of a substrate for an image display is not especially limited. However, for example, there are an electrophoretic display, a liquid crystal display and an organic electroluminescence (EL) display.

In addition, a thin film transistor array of the present invention can include a sealing layer 13, an interlayer dielectric 14, an upper pixel electrode 29, a gas barrier layer and a planarizing layer as needed.

In addition, the name "source/drain" is conveniently used. That is, the name can be called reversely "drain/source". In the present invention, an electrode connected to a source wire 28 is called as a source electrode 27 and an electrode connected to a pixel electrode 25 is called as a drain electrode 26.

As mentioned above, according to the present invention, the arrangement of a thin film transistor array is optimized so that a stripe shaped semiconductor layer can be formed. As a result, even if a semiconductor layer is formed by a printing method, high throughput and high alignment accuracy can be realized.

Hereinafter, examples are described.

EXAMPLE 1 IS DESCRIBED

Figure 2:
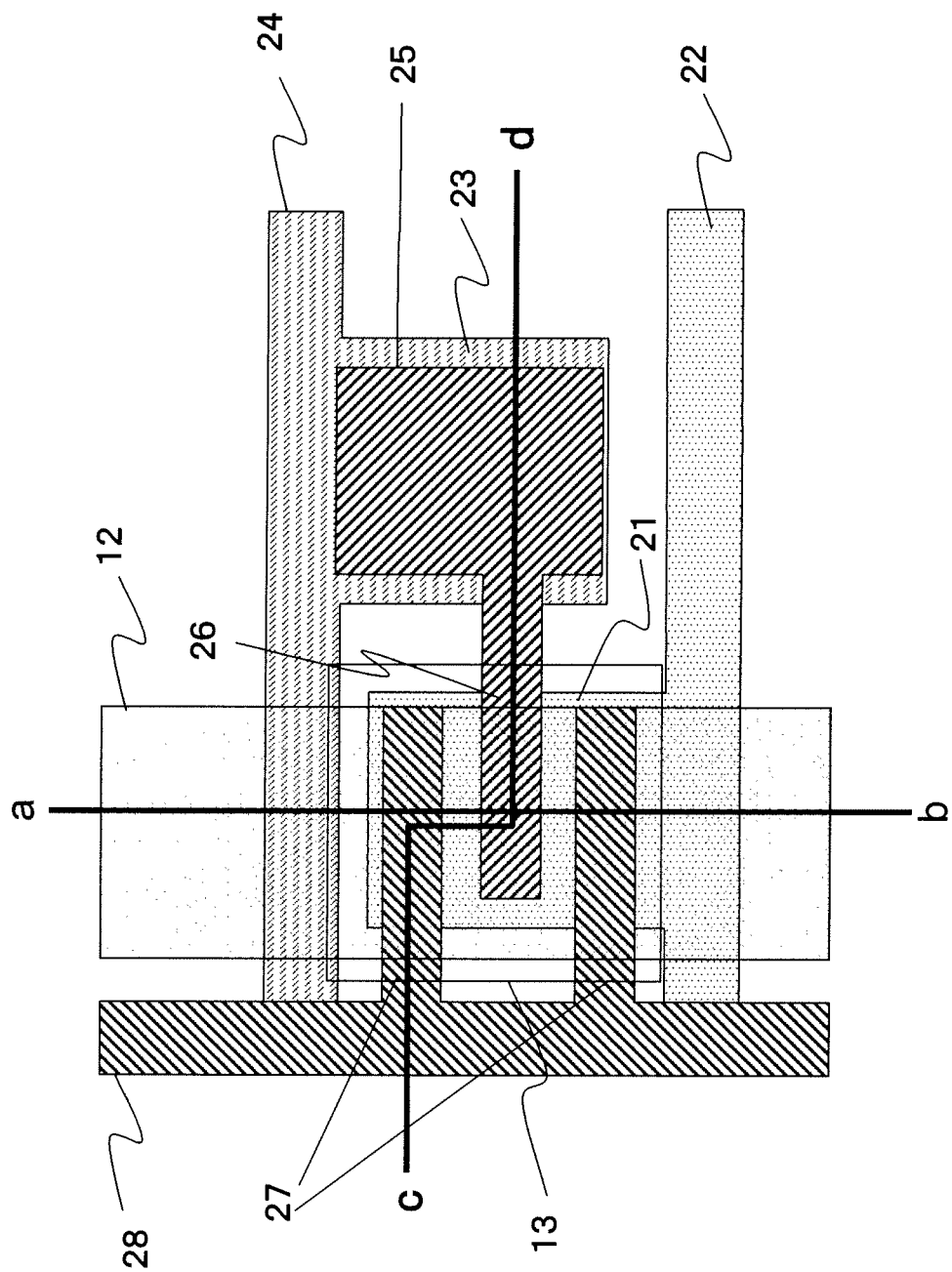
FIG. 2 is an enlarged figure of one pixel in FIG. 1.
Figure 3:
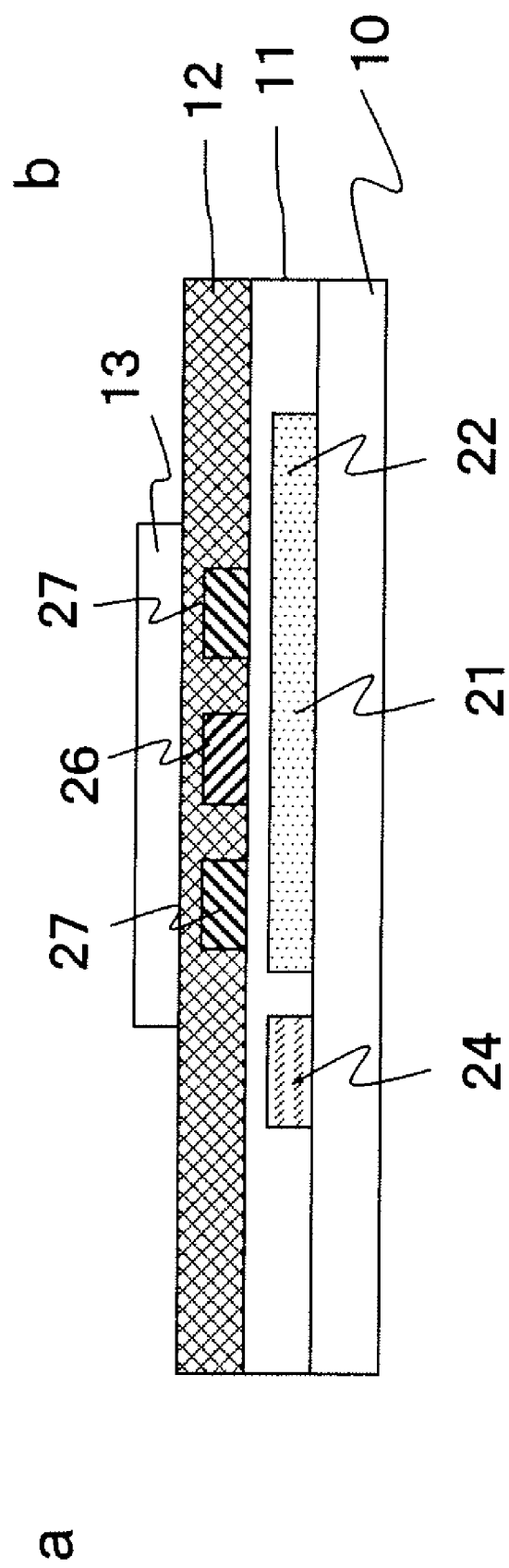
FIG. 3 is a cross-sectional view taken along the line a-b in FIG. 2.
Figure 4:
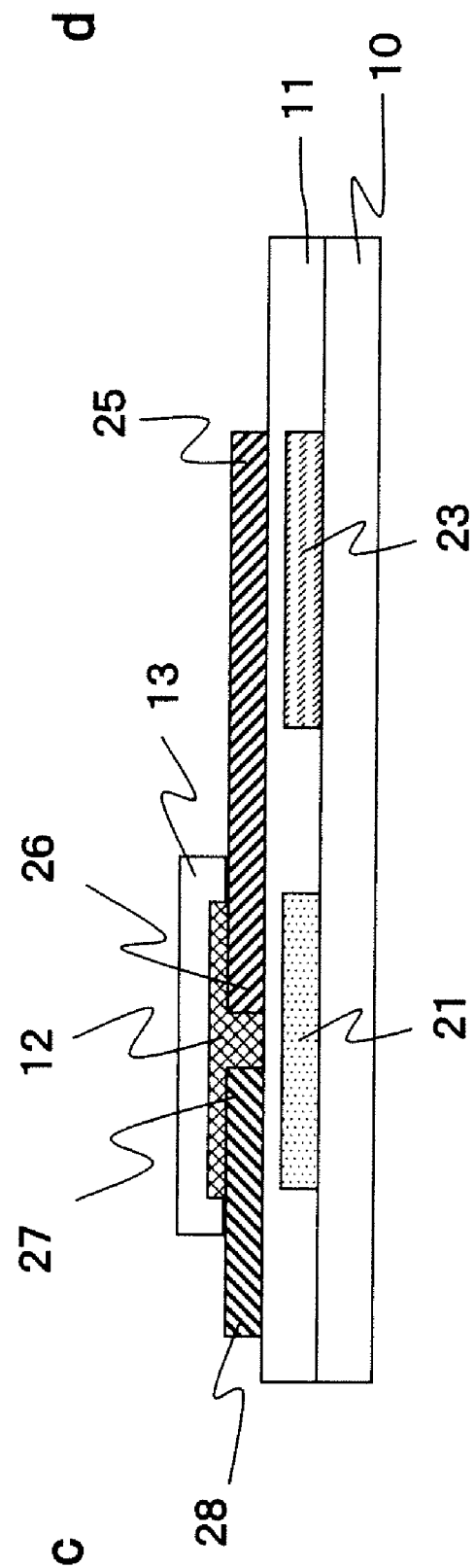
FIG. 4 is a cross-sectional view taken along the line c-d in FIG. 2.

In this example, a method for manufacturing a bottom gate/bottom contact type thin film transistor array as shown in FIG. 1, FIG. 2 (an enlarged figure) and FIG. 3, FIG. 4 (a cross-sectional view) is described.

A polyethylenenaphthalate (PEN) film (a product made in Teijin Du Pont) was used for a substrate 10. A nanosilver ink (Nanosilver made in Sumitomo Electric Industries: Polyethylene glycol #200 made by Aldrich=8:1 (ratio in weight) ) was printed on the PEN substrate 10 by a reverse type offset printing method. After having baked the substrate 10 at 180° C. for 1 hour, a gate electrode 21, a gate wire 22, a capacitor electrode 23 and a capacitor wire 24 were obtained. Polyimide (Neopulim made in Mitsubishi Gas Chemical) was applied to the substrate 10 by a die coater. Thereafter, a gate insulator 11 was formed by drying the substrate 10 at 180° C. for 1 hour. A nanosilver ink (Nanosilver made in Sumitomo Electric Industries: Polyethylene glycol #200 made by Aldrich 8:1 (ratio in weight) ) as materials of source electrode 27, drain electrode 26, a source wire 28 and a pixel electrode 25 is printed over the PEN substrate by a reverse type offset printing method. After having baked the substrate, a source electrode 27, a drain electrode 26, a source wire 28 and a pixel electrode 25 were formed.

A semiconductor layer 12 was formed by the following processes: a solution in which Liscon SP200 (a product made in Merck) was dissolved in tetralin (a product made in KANTO KAGAKU) so that Liscon SP200 was 1.0 weight % was used as a semiconductor material. A photosensitive resin relief plate was used as a relief printing plate. An anilox roll with 150 lines was used. A stripe-shaped semiconductor layer 12 was formed by printing the semiconductor material by a relief printing. The semiconductor layer 12 was formed by drying the semiconductor material at 100° C. for 1 hour.

A sealing layer 13 was formed by the following processes: a fluorine system resin (CYTOP: a product of ASAHI GLASS) was used as a sealing material. The sealing material was printed by a screen printing. The sealing layer 13 was formed by drying the sealing material in vacuum at 90° C. for 2 hours.

Thereafter, when a display made by sandwiching electrophoretic medium between this substrate and a counter electrode was drove, a good image could be displayed.

EXAMPLE 2 IS DESCRIBED

Figure 6:
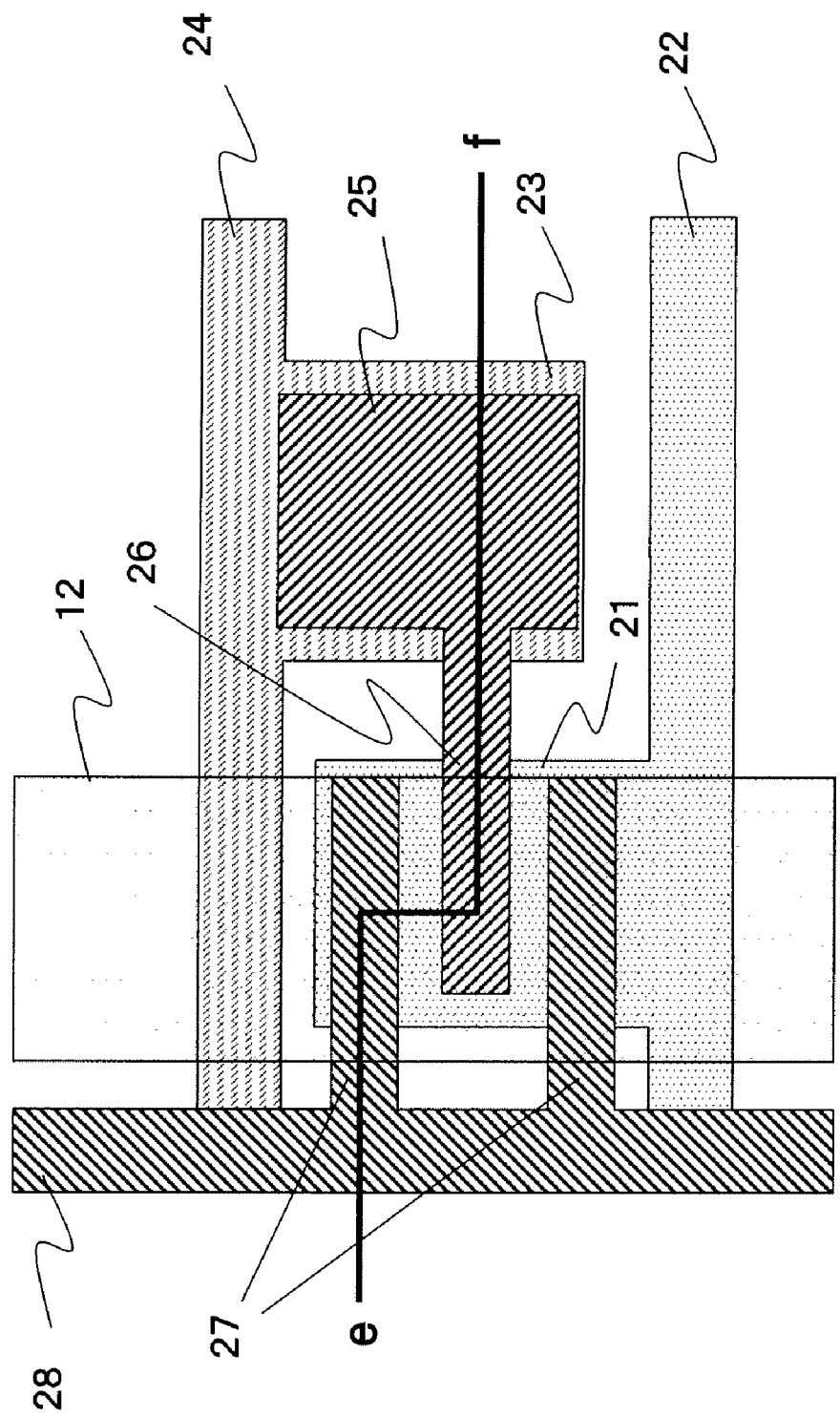
FIG. 6 is an enlarged view of one pixel in FIG. 5.
Figure 7:
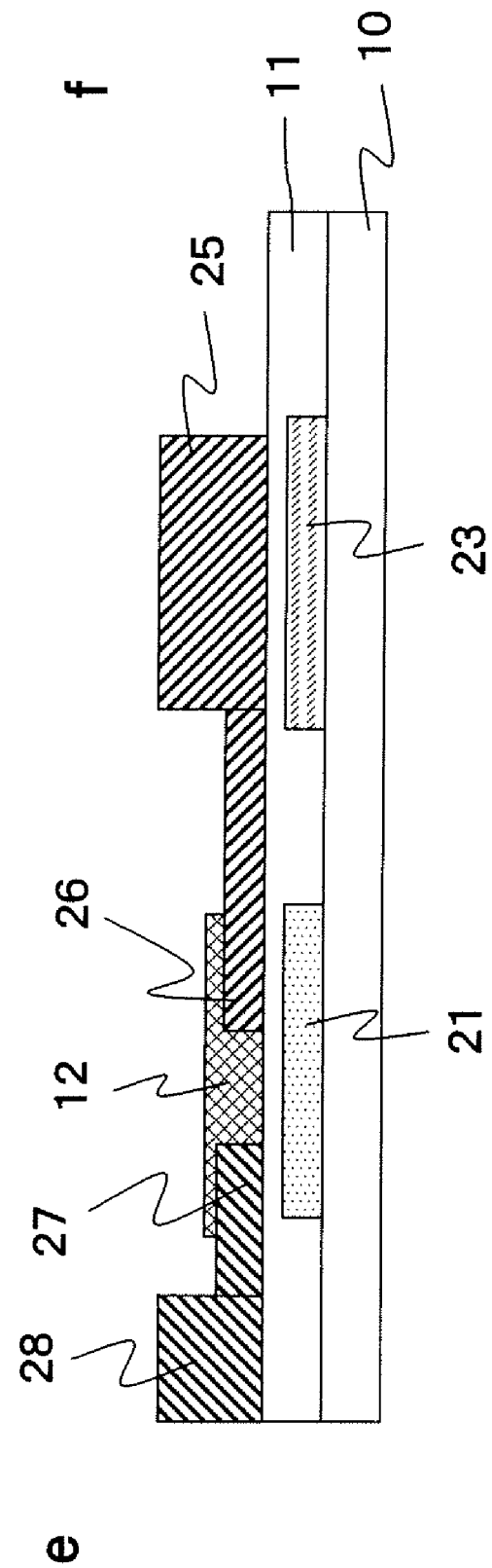
FIG. 7 is a cross-sectional view taken along the line e-f in FIG. 6.

In this example, a method for manufacturing a bottom gate/bottom contact type thin film transistor array as shown in FIG. 5, FIG. 6 (an enlarged figure) and FIG. 7 (a cross-sectional view) is described.

A polyimide film (a product of UBE KOUSAN) was used for a substrate 10. A nanosilver ink (Nanosilver made in Sumitomo Electric Industries) was printed on the polyimide substrate by a relief printing. A gate electrode 21, a gate wire 22, a capacitor electrode 33 and a capacitor wire 24 were formed by baking the substrate at 180° C. for 1 hour. Polyvinyl phenol (a product of Aldrich) was applied to the substrate by a die coater as a gate insulator 11. The gate insulator 11 was formed by baking the polyvinyl phenol at 180° C. for 1 hour. A nanosilver ink (Nanosilver made in Sumitomo Electric Industries: Polyethylene glycol #200 made by Aldrich=8:1 (ratio in weight)) was used as a source electrode 27 and drain electrode 26 material. The nanosilver ink was printed on the substrate by reverse type offset printing. A source electrode 27 and a drain electrode 26 were formed by baking the ink at 180° C. for 1 hour. A silver paste (a product of Sumitomo Electric Industries) was used as a material of a source wire 28 and a pixel electrode 25. The paste was printed on the substrate by a screen printing. A source wire 28 and a pixel electrode 25 were formed by baking the paste at 180° C. for 1 hour.

A semiconductor layer 12 was formed by the following processes: a solution in which Liscon SP200 (a product made in Merck) was dissolved in tetralin (a product made in KANTO KAGAKU) so that Liscon SP200 was 1.0 weight % was used as a semiconductor material; a stripe-shaped semiconductor layer 12 was formed by a printing using a dispenser; and the semiconductor layer 12 was formed by drying the semiconductor at 100° C. for 1 hour.

Thereafter, when a display made by sandwiching electrophoretic medium between this substrate and a counter electrode was drove, a good image could be displayed.

EXAMPLE 3 IS DESCRIBED

Figure 9:
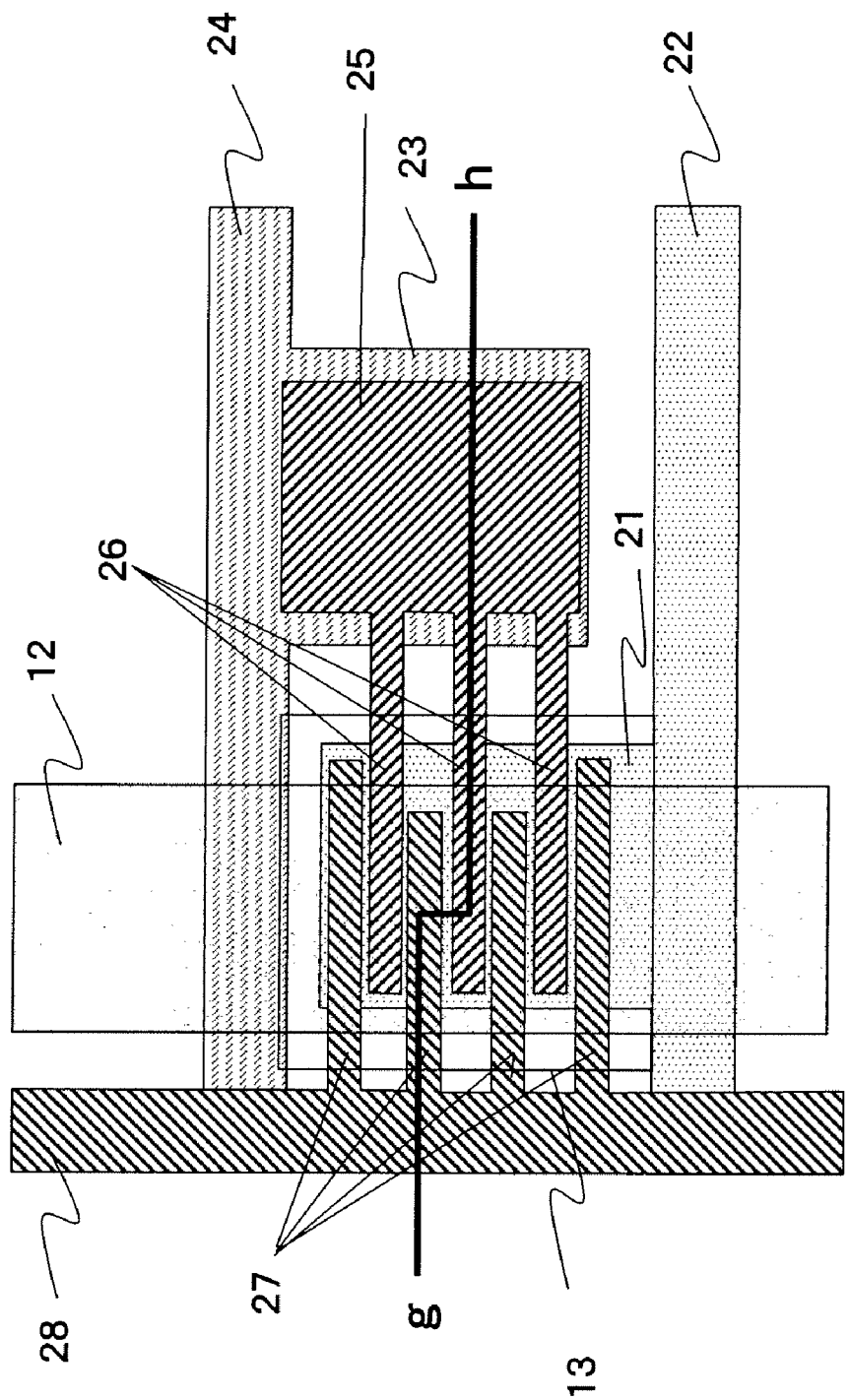
FIG. 9 is an enlarged view of one pixel in FIG. 8.
Figure 10:
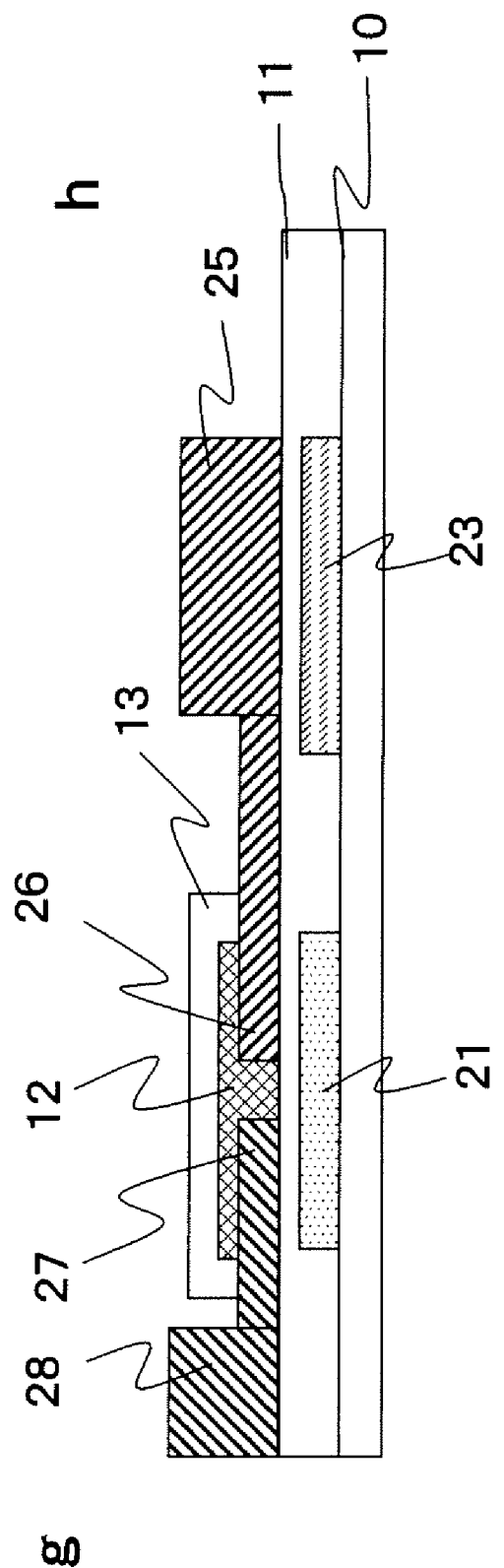
FIG. 10 is a cross-sectional view taken along the line g-h in FIG. 9.

In this example, a method for manufacturing a bottom gate/bottom contact type thin film transistor array as shown in FIG. 8, FIG. 9 (an enlarged figure) and FIG. 10 (a cross-sectional view) is described.

A polyimide film (a product of UBE KOUSAN) was used for a substrate 10. A nanosilver ink (Nanosilver made in Sumitomo Electric Industries: Polyethylene glycol #200 made by Aldrich=8:1 (ratio in weight)) was printed on the substrate by a reverse type offset printing method. After having baked the substrate at 180° C. for 1 hour, a gate electrode 21, a gate wire 22, a capacitor electrode 23 and a capacitor wire 24 were obtained. Polyimide (Neopulim made in Mitsubishi Gas Chemical) was applied to the substrate by a die coater. Thereafter, a gate insulator 11 was formed by drying the substrate at 180° C. for 1 hour. A nanosilver ink (Nanosilver made in Sumitomo Electric Industries: Polyethylene glycol #200 made by Aldrich=8:1 (ratio in weight)) was used as a source electrode 27 and drain electrode 26 material. The nanosilver ink was printed on the substrate by reverse type offset printing. A source electrode 27 and a drain electrode 26 were formed by baking the ink at 180° C. for 1 hour. A silver paste (a product of Sumitomo Electric Industries) was used as a material of a source wire 28 and a pixel wire 25. The paste was printed was printed on the substrate by a screen printing. A source electrode 28 and a pixel electrode 25 were formed by baking the paste at 180° C. for 1 hour. A semiconductor layer 12 was formed by the following processes: a solution in which Liscon SP200 (a product made in Merck) was dissolved in tetralin (a product made in KANTO KAGAKU) so that Liscon SP200 was 1.0 weight % was used as a semiconductor material. A photosensitive resin relief plate was used as a relief printing plate. An anilox roll with 150 lines was used. A stripe-shaped semiconductor was formed by printing the semiconductor material by a relief printing. The semiconductor layer 12 was formed by drying the semiconductor material at 100° C. for 1 hour.

A sealing layer 13 was formed by the following processes: a fluorine system resin (CYTOP: a product of ASAHI GLASS) was used as a sealing material. The sealing material was printed by a screen printing. The sealing layer 13 was formed by drying the sealing material in vacuum at 90° C. for 2 hours.

Thereafter, when a display made by sandwiching electrophoretic medium between this substrate and a counter electrode was drove, a good image could be displayed.

EXAMPLE 4 IS DESCRIBED

Figure 11:
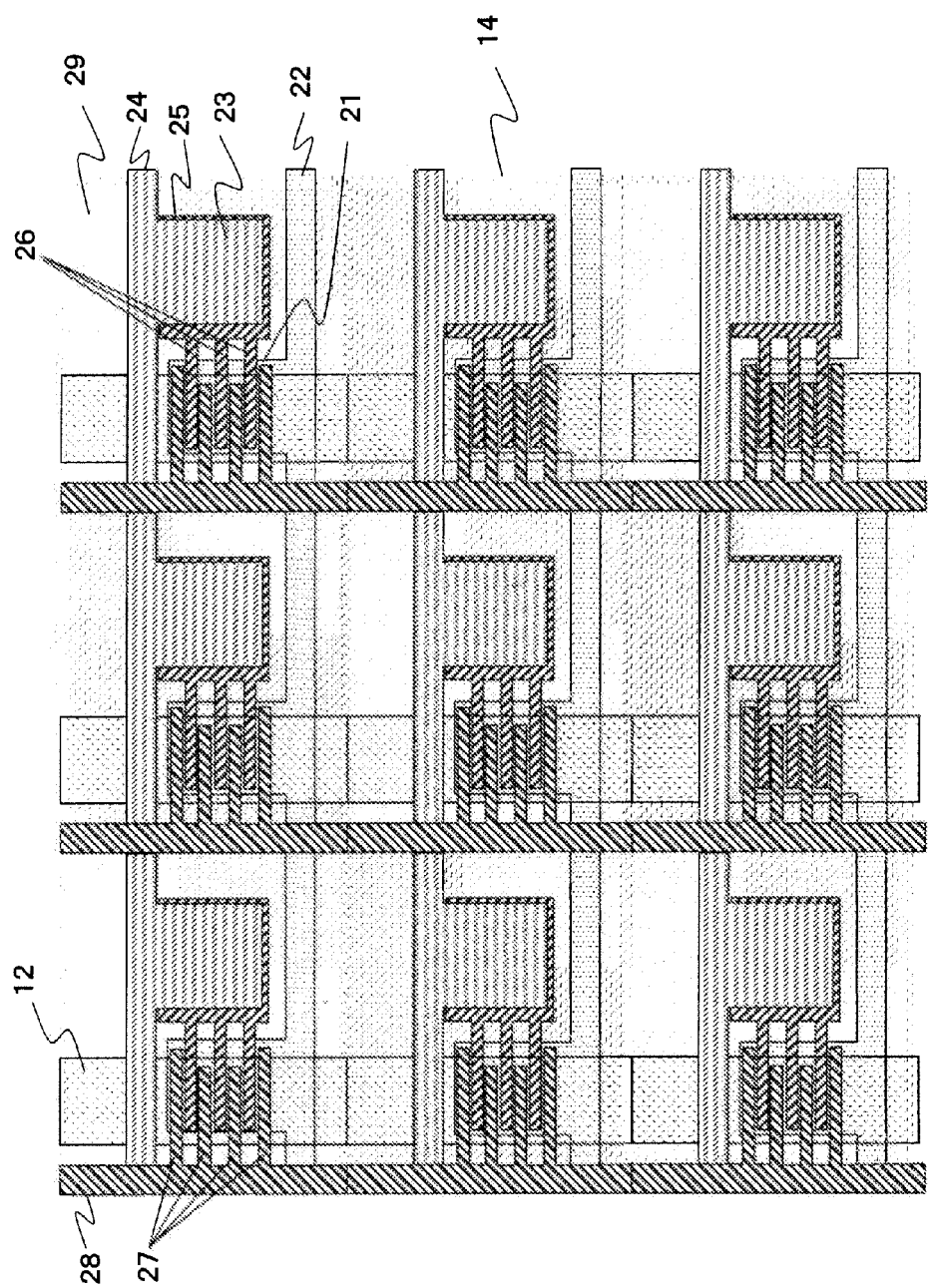
FIG. 11 is a schematic diagram of a thin film transistor (top gate/bottom contact type) of the present invention, wherein a comb-tooth in most outer part of a source electrode is longer than the other comb-teeth of a source electrode, inside each pixel region.
Figure 12:
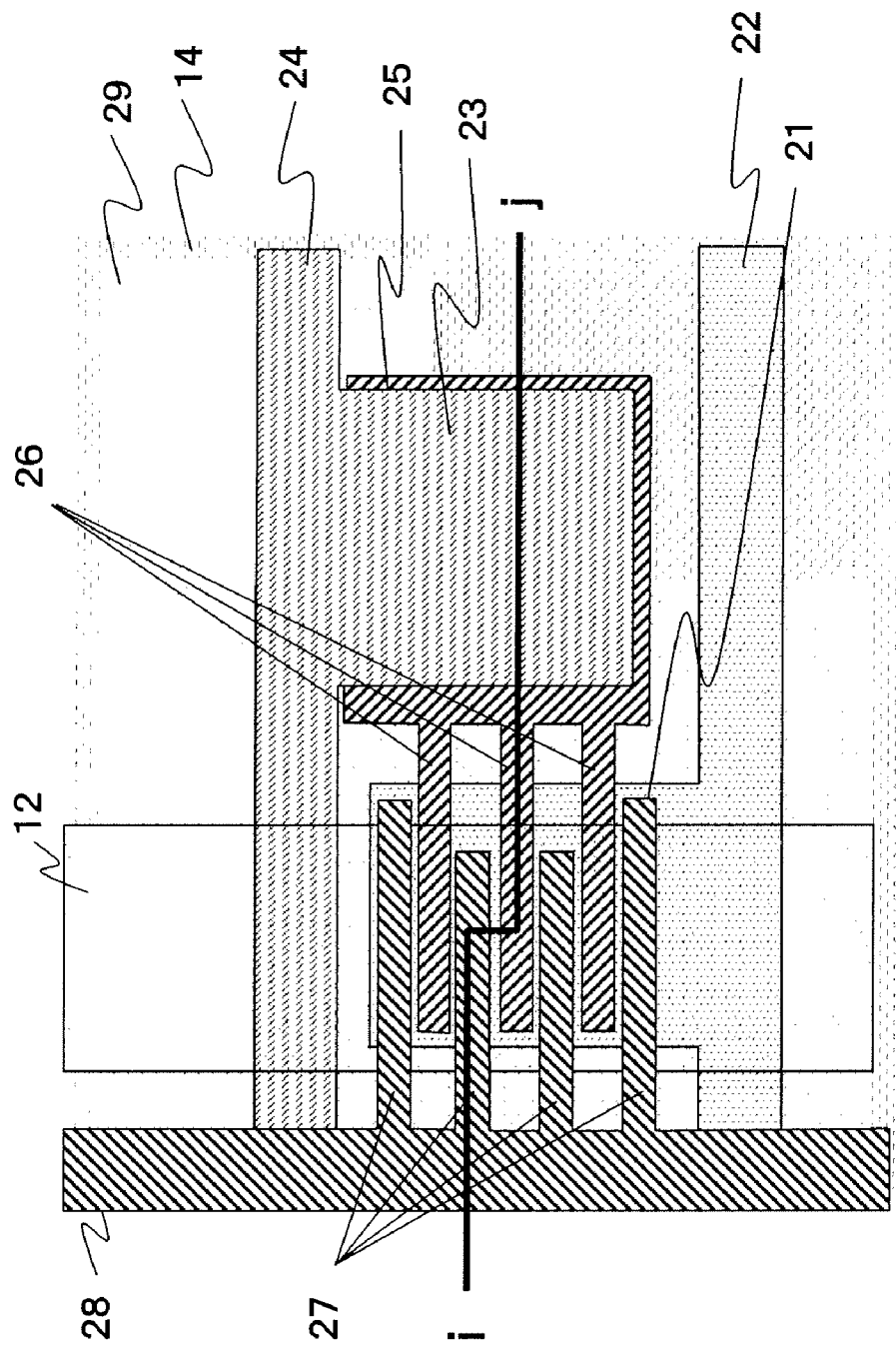
FIG. 12 is an enlarged view of one pixel in FIG. 11.
Figure 13:
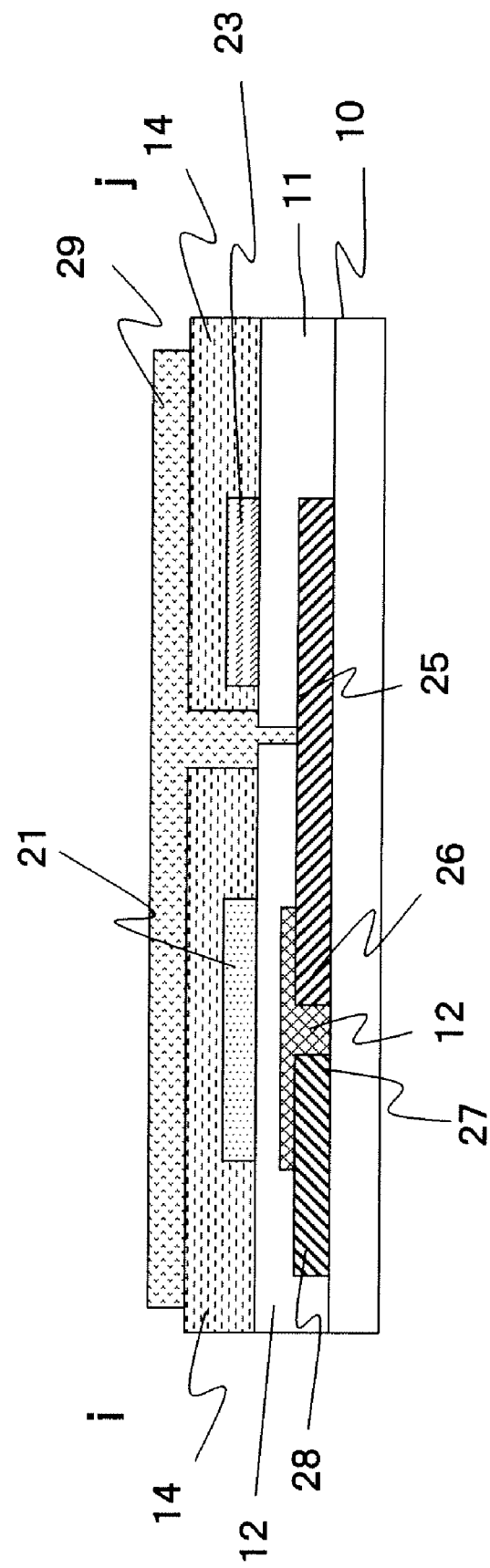
FIG. 13 is a cross-sectional view taken along the line i-j in FIG. 12.

In this example, a method for manufacturing a top gate/bottom contact type thin film transistor array as shown in FIG. 11, FIG. 12 (an enlarged figure) and FIG. 13 (a cross-sectional view) is described.

A polyethylenenaphthalate (PEN) film (a product made in Teijin Du Pont) was used for a substrate 10. A nanosilver ink (Nanosilver made in Sumitomo Electric Industries: Polyethylene glycol #200 made by Aldrich=8:1 (ratio in weight)) was printed on the PEN substrate by a reverse type offset printing method. After having baked the substrate at 180° C. for 1 hour, a source electrode 27, a drain electrode 26, a source wire 28 and a pixel electrode 25 were obtained.

A semiconductor layer 12 was formed by the following processes: a solution in which Fluorene BT [2,2'-bithiophene] copolymer (F8T2) was dissolved in tetralin (a product made in KANTO KAGAKU) so that Fluorene BT [2,2'-bithiophene] copolymer (F8T2) was 1.0 weight % was used as a semiconductor material. A photosensitive resin relief plate was used as a relief printing plate. An anilox roll with 150 lines was used. A stripe-shaped semiconductor was formed by printing the semiconductor material by a relief printing. The semiconductor layer 12 was formed by drying the semiconductor material at 100° C. for 1 hour.

Polyvinyl phenol (a product of Aldrich) was applied to the substrate by an ink jet method as a gate insulator 11. The gate insulator 11 was formed by baking the polyvinyl phenol at 180° C. for 1 hour. A silver paste (a product of Sumitomo Electric Industries) was used as a material of a gate electrode 21, a gate wire 22, a capacitor electrode 23 and a capacitor wire 24. The paste was printed on the substrate by a screen printing. A gate electrode 21, a gate wire 22, a capacitor electrode 23 and a capacitor wire 24 were formed by baking the paste at 180° C. for 1 hour. An epoxy resin (a product of Ajinomoto-Fine-Techno Co., Inc.) was used as an interlayer dielectric material. The material was printed on the substrate by a screen printing. An interlayer dielectric 14 was formed by drying the material at 90° C. for 1 hour. A silver paste (a product of Ajinomoto-Fine-Techno Co., Inc.) was used as an upper pixel electrode material. The material was printed on the substrate by a screen printing. An upper pixel electrode 29 was formed by drying the material at 90° C. for 1 hour.

Thereafter, when a display made by sandwiching electrophoretic medium between this substrate and a counter electrode was drove, a good image could be displayed.

EXAMPLE 5 IS DESCRIBED

Figure 14:
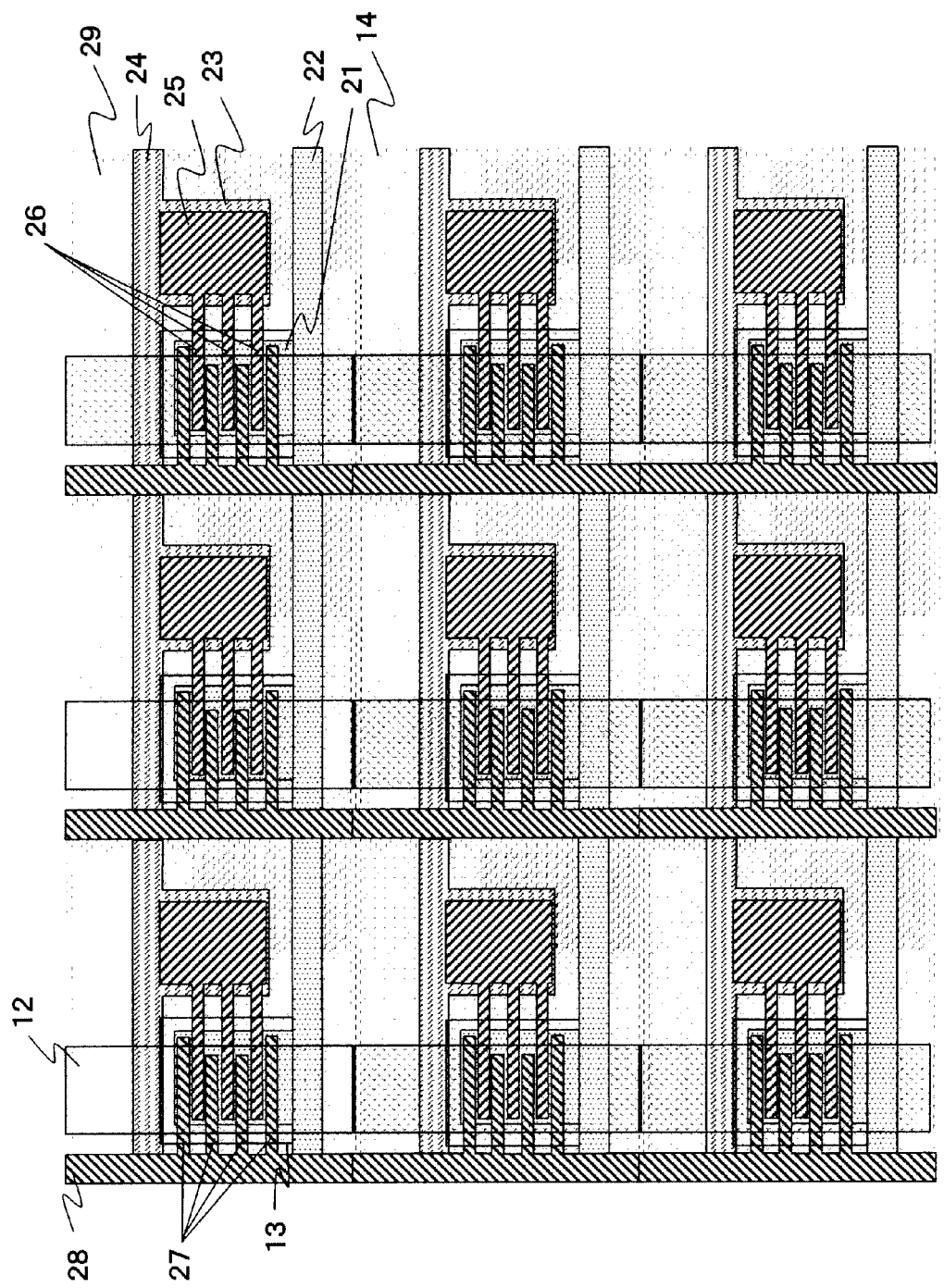
FIG. 14 is a schematic diagram of a thin film transistor showing an embodiment of the present invention (bottom gate/bottom contact type).
Figure 15:
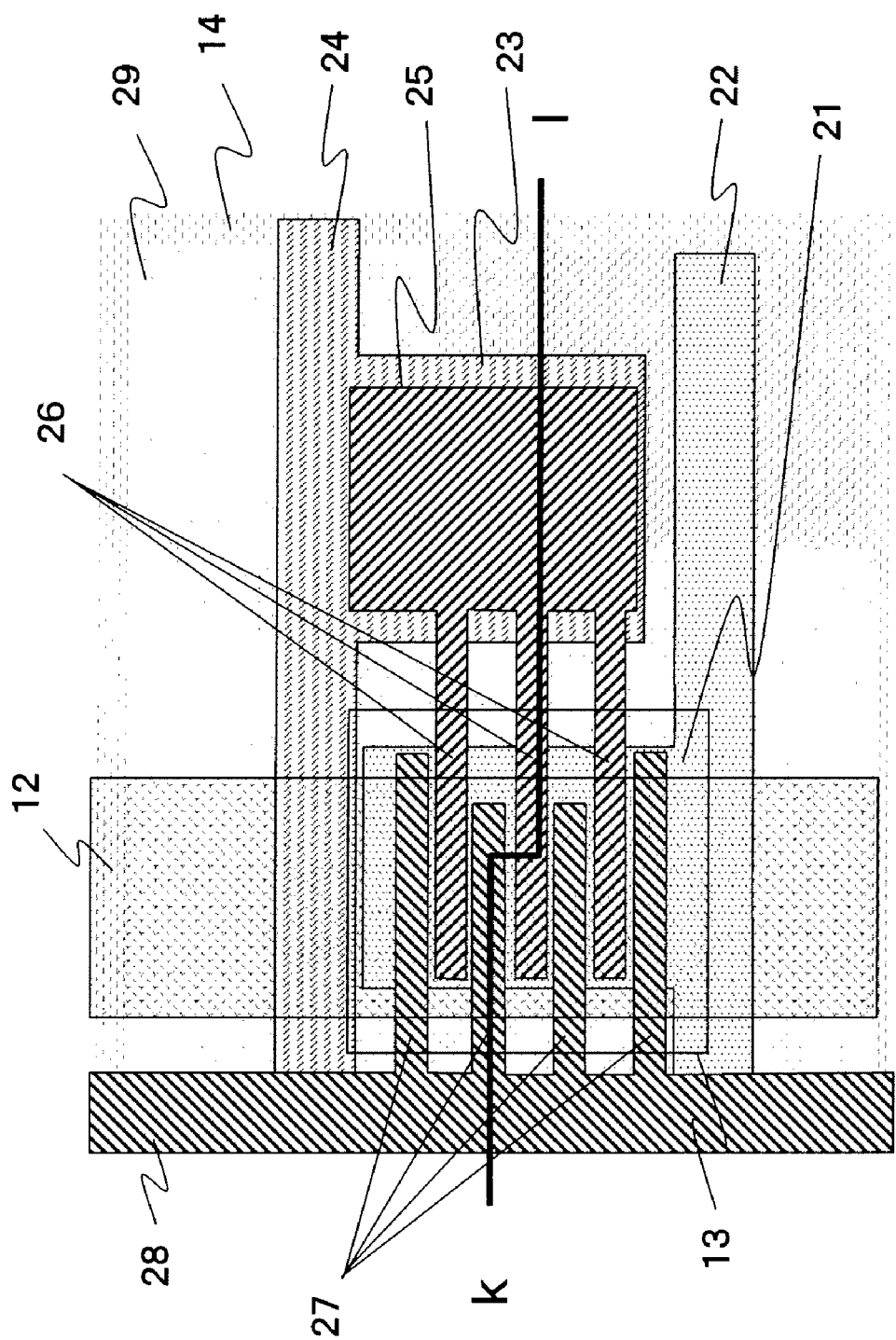
FIG. 15 is an enlarged view of one pixel in FIG. 14.
Figure 16:
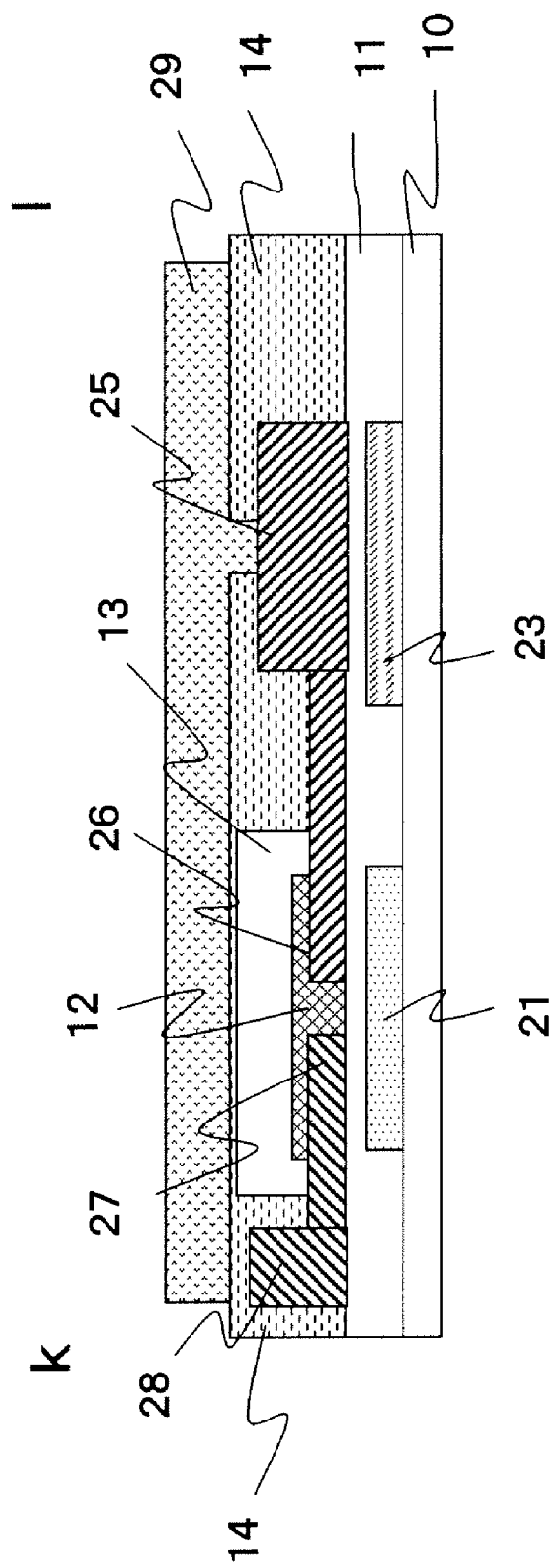
FIG. 16 is a cross-sectional view taken along the line k-l in FIG. 15.

In this example, a method for manufacturing a bottom gate/bottom contact type thin film transistor array having a sealing layer 13, an interlayer dielectric 14 and an upper pixel electrode 29, shown in FIG. 14, FIG. 15 (an enlarged figure) and FIG. 16 (a cross-sectional figure) is described.

Elements to a semiconductor layer were formed by the same method as Example 3.

A fluorine system resin (CYTOP: a product of ASAHI GLASS) was used. The resin was printed on the substrate by a screen printing. The resin was dried in vacuum at 90° C. for 2 hours, thereby a sealing layer 13 was formed.

An epoxy resin (a product of Ajinomoto-Fine-Techno Co., Inc.) was used as an interlayer dielectric material. The resin was printed on the substrate by a screen printing. The resin was dried at 90° C. for 1 hour, thereby an interlayer dielectric 14 was formed.

A silver paste (a product of Ajinomoto-Fine-Techno Co., Inc.) was used as an upper pixel electrode material. The paste was printed on the substrate by a screen printing. The paste was dried at 90° C. for 1 hour, thereby an upper pixel electrode 29 was formed.

Thereafter, when a display made by sandwiching electrophoretic medium between this substrate and a counter electrode was drove, a good image could be displayed. The contrast was improved compared with Example 3.

Figure 18:
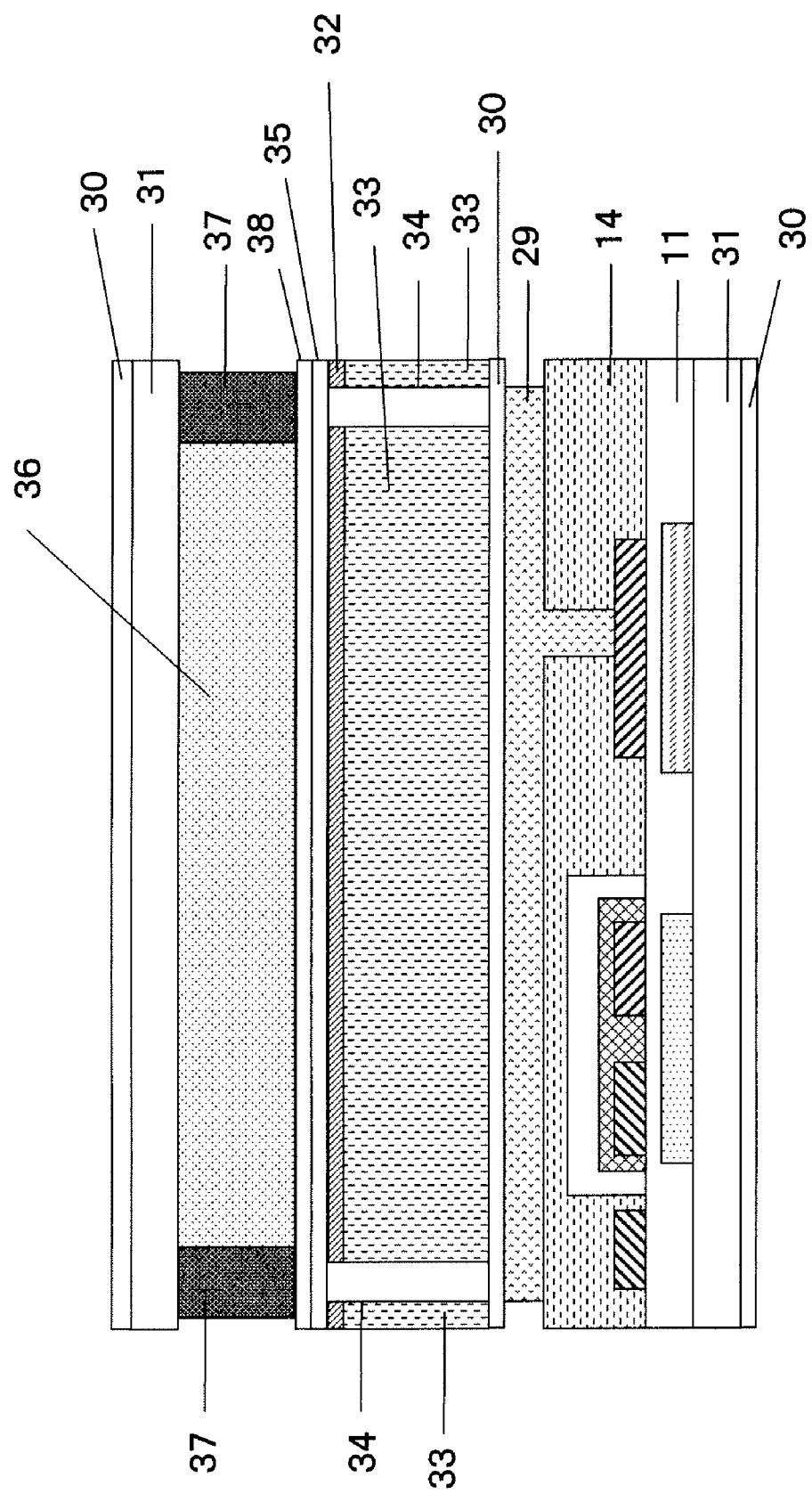
FIG. 18 is a schematic diagram of a liquid crystal display device which is an embodiment of the present invention.
Figure 19:
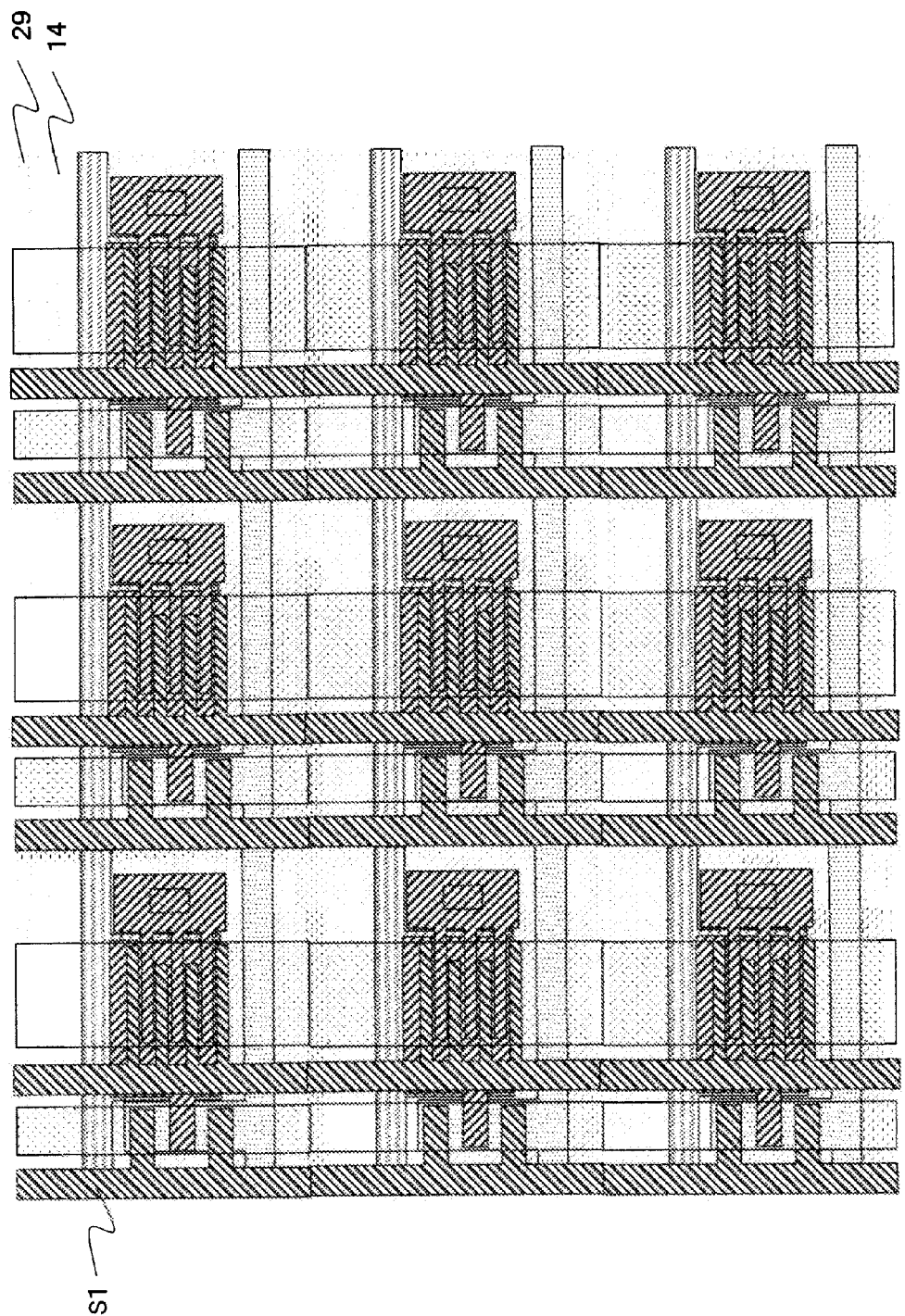
FIG. 19 is a schematic diagram of a thin film transistor array for a EL display device which is an embodiment of the present invention.
Figure 20:
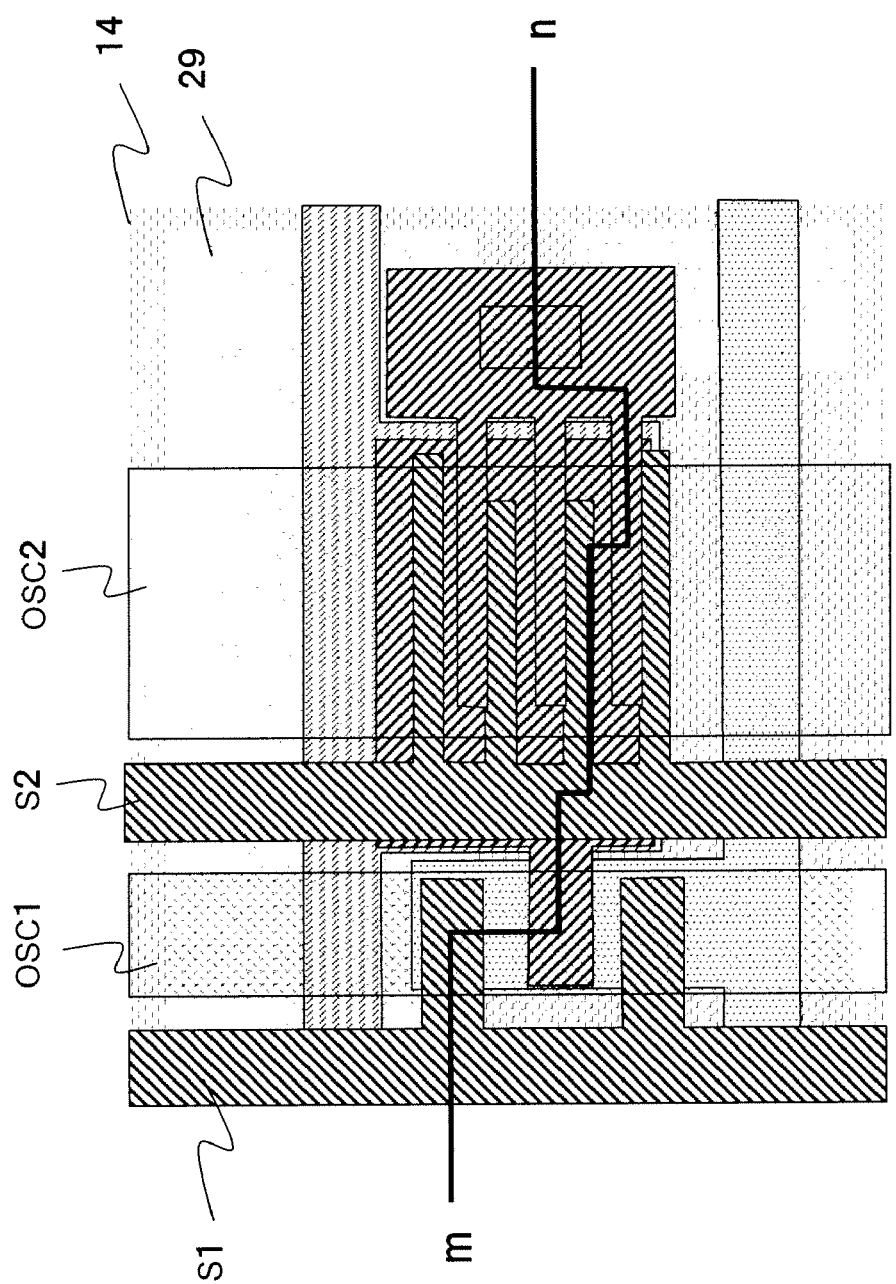
FIG. 20 is an enlarged view of one pixel in FIG. 19.
Figure 21:
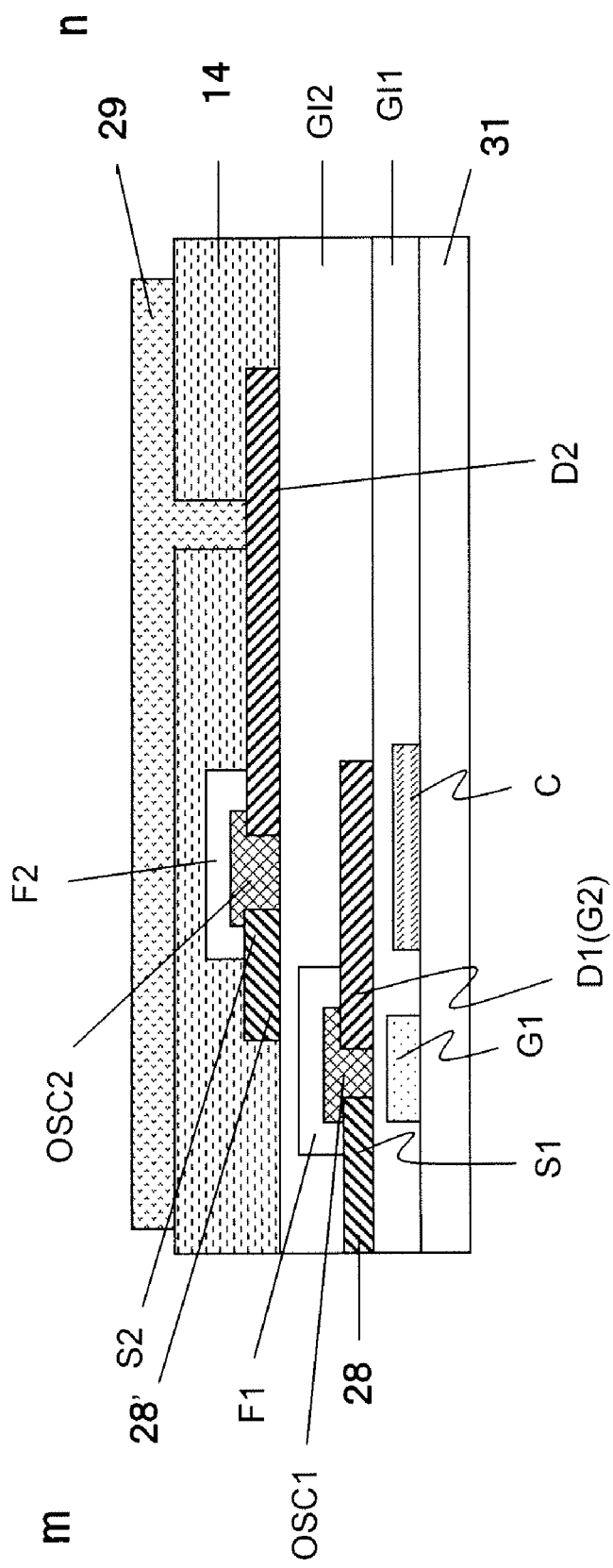
FIG. 21 is a cross-sectional view taken along the line m-n in FIG. 20.
Figure 22:
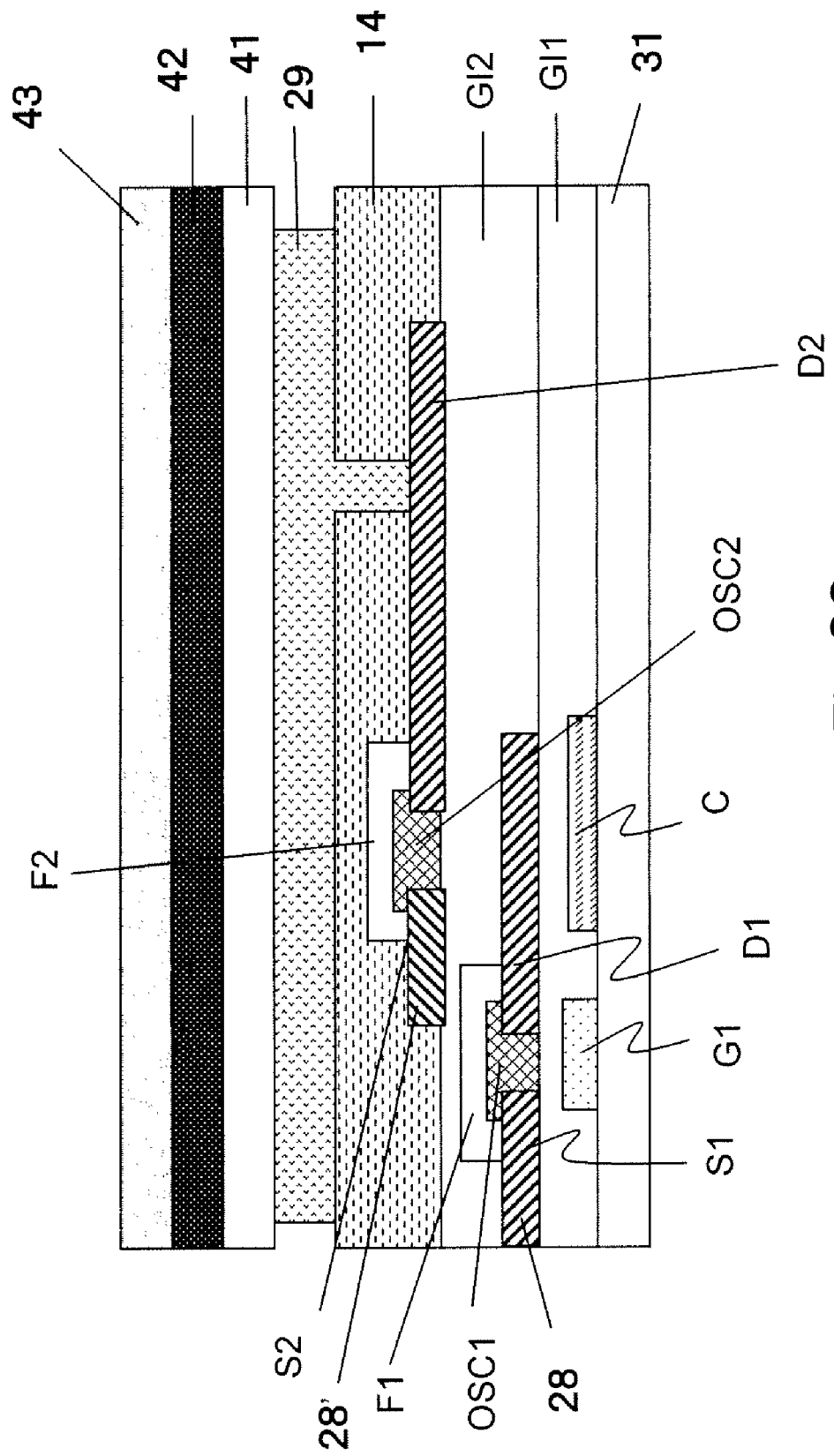
FIG. 22 is a cross-sectional view of an organic EL layer formed on a thin film transistor shown in FIG. 20.
Figure 23:
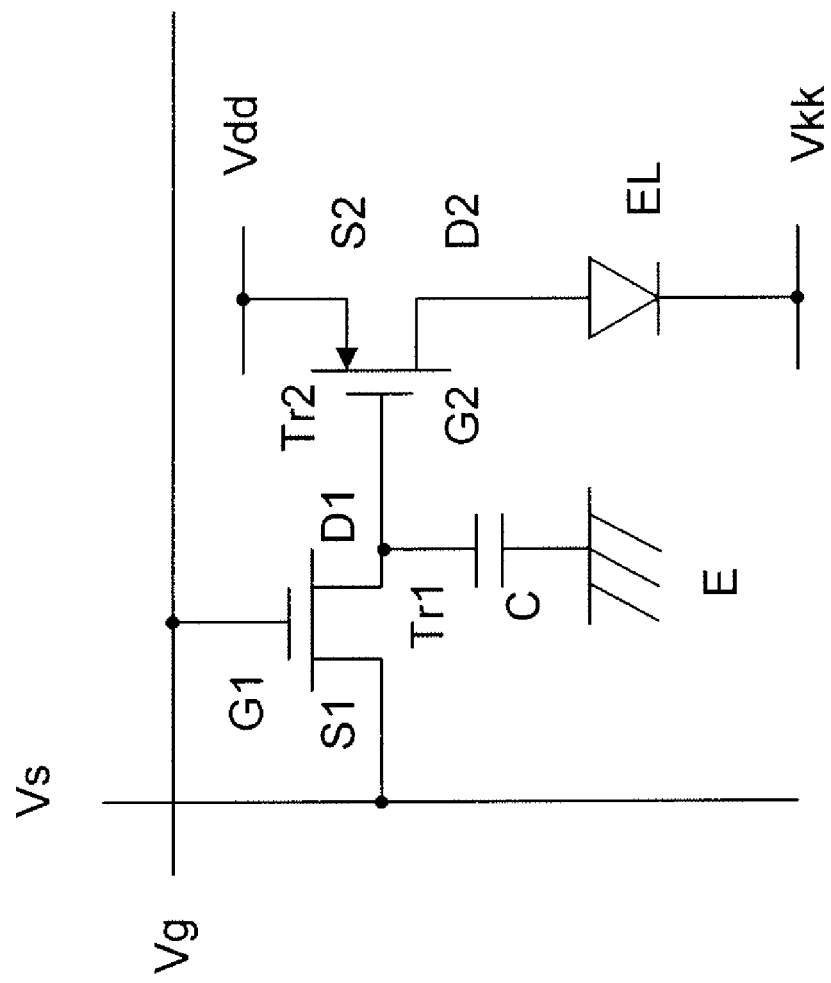
FIG. 23 is an example of a driving circuit of an organic EL display.

Example 6 is described below. As shown in FIG. 18, alkali free glass 1737 (0.7 mm thickness; a product of Corning Incorporated) was used for glass substrate 31. Color filter layers were formed on glass substrate 31 using resists in which pigments of red, green, blue and black were respectively dispersed by a photolithography method. A protective layer was formed on the entire surface using a transparent resin. Indium tin oxide (ITO) was deposited for forming a common electrode by a sputtering method. Thereafter, spacer 34 was formed by photolithography using a transparent photosensitive resin.

Next, orientation film 32 was formed by a spin coating, thereby a substrate with color filters was manufactured. On the other hand, upper pixel electrode 29 and other elements under upper pixel electrode 29 were formed on another glass substrate 31 by the same method as Example 5. Next, orientation film 32 was formed by the above-mentioned method to manufacture a TFT substrate.

The substrate with color filters and the TFT substrate, which were manufactured in this way, were attached to each other while position adjustment was conducted. The space between the substrate with color filters and the TFT substrate was filled with liquid crystal 33. Next, polarizing plate 30 was formed on a surface of the substrate with color filters, the surface having no color filters. Polarizing plate 30 was formed on a surface of the TFT substrate, the surface having no TFT. Thereby, a reflective type liquid crystal display device was manufactured. When the device was driven, display was good.

Example 7 is described below. As shown in FIGS. 19, 20, 21, 22 and 23, alkali free glass 1737 (0.7 mm thickness; a product of Corning Incorporated) was used as a glass substrate. Gate electrode (G1) and capacitor electrode (C) were formed by the following processes: ITO was deposited by a sputtering method; and patterning of ITO was conducted by applying a photo resist, exposure, development, etching and peeling of the resist.

As gate insulator (GI1), polyvinyl phenol (a product of Aldrich) was applied to the substrate by ink jet method. Gate insulator (GI1) was formed by baking it at 180° C. for 1 hour.

For source electrode (S1) and drain electrode (D1) which is also gate electrode (G2), ITO was deposited by a sputtering method. Patterning of ITO was conducted by applying a photo resist, exposure, development, etching and peeling of the resist.

A semiconductor layer 12 was formed by the following processes: a solution in which Fluorene BT [2,2'-bithiophene] copolymer (F8T2) was dissolved in tetralin (a product made in KANTO KAGAKU) so that Fluorene BT [2,2'-bithiophene] copolymer (F8T2) was 1.0 weight % was used as a semiconductor material. A photosensitive resin relief plate was used as a relief printing plate. An anilox roll with 150 lines was used. A stripe-shaped semiconductor was formed by printing the semiconductor material by a relief printing. Organic semiconductor layer (OSC1) was formed by drying the semiconductor material at 100° C. for 1 hour.

A sealing layer (F1) was formed by the following processes: a fluorine system resin (CYTOP: a product of ASAHI GLASS) was used as a sealing material. The sealing material was printed by a screen printing. The sealing layer (F1) was formed by drying the sealing material in vacuum at 90° C. for 2 hours.

Again, as gate insulator (GI2), polyvinyl phenol (a product of Aldrich) was applied to the substrate by ink jet method. Gate insulator (GI2) was formed by baking it at 180° C. for 1 hour.

For source electrode (S2) and drain electrode (D2), ITO was deposited by a sputtering method. Patterning of ITO was conducted by applying a photo resist, exposure, development, etching and peeling of the resist.

Again, a semiconductor layer 12 was formed by the following processes: a solution in which Fluorene BT [2,2'-bithiophene] copolymer (F8T2) was dissolved in tetralin (a product made in KANTO KAGAKU) so that Fluorene BT [2,2'-bithiophene] copolymer (F8T2) was 1.0 weight % was used as a semiconductor material. A photosensitive resin relief plate was used as a relief printing plate. An anilox roll with 150 lines was used. A stripe-shaped semiconductor was formed by printing the semiconductor material by a relief printing. Organic semiconductor layer (OSC2) was formed by drying the semiconductor material at 100° C. for 1 hour.

A sealing layer (F2) was formed by the following processes: a fluorine system resin (CYTOP: a product of ASAHI GLASS) was used as a sealing material. The sealing material was printed by a screen printing. The sealing layer (F2) was formed by drying the sealing material in vacuum at 90° C. for 2 hours.

As a material of interlayer dielectric 14, a photosensitive transparent acryl resin was used. Exposure and development were conducted. Interlayer dielectric 14 was formed by baking it at 180° C. for 30 minutes.

As a material of upper pixel electrode 29, ITO was deposited by a sputtering method. Patterning of ITO was conducted by applying a photo resist, exposure, development, etching and peeling of the resist.

Thereafter, as hole transport layer 41, poly (ethylenedioxy thiophen)/polystyrene sulfonate (PEDOT/PSS) was applied to the entire surface by a spin coating. Poly (ethylenedioxy thiophen)/polystyrene sulfonate (PEDOT/PSS) was dried at 100° C. for 1 hour.

Next, light emitting layers 42 of a red light emitting layer, a green light emitting layer and a blue light emitting layer, these layers comprising polyfluorene system substance, was sequentially formed by a relief printing method. Further, Ca and Ag were deposited on the entire surface as common electrode 43 by evaporation. Finally, the whole body was covered by a sealing glass (not illustrated). When this color organic EL display was driven, display was good.

EXAMPLE 8 IS DESCRIBED BELOW

A display was manufactured by the same method as Example 1 except that source electrode 27 and drain electrode 26, which are not comb-teeth shaped, was formed.

When the electrophoretic type display was driven, a little reduction of contrast was recognized since a small electric current flew between adjacent pixels which are parallel to source wire 28. However, driving the display was possible.

COMPARATIVE EXAMPLE 1 IS DESCRIBED

A display was manufactured by the same method as Example 1 other than a semiconductor layer formed by a spin coat method. In Comparative Example 1, cross-talk in a scan direction was observed when electrophoretic type display was driven.

COMPARATIVE EXAMPLE 2 IS DESCRIBED

A display was manufactured by the same method as Example 2 other than a semiconductor layer 12 of dot-shaped, not stripe-shaped, formed by a dispenser method.

When electrophoretic type display was driven, a display state of an image was not different from Example 2 having a stripe-shaped semiconductor. However, the manufacturing time was 10 times of that of Example 2.

In addition, when a tape peeling test was conducted, fifteen semiconductor patterns among a hundred semiconductor pattern was peeled due to insufficient adhesion.

What is claimed is:

1. A thin film transistor array, comprising:
   thin film transistors,
   each of the thin film transistors comprising:
   an insulating substrate;
   a gate electrode on the insulating substrate;
   a gate insulator;
   a source electrode and drain electrode; and
   a semiconductor layer between the source electrode and the drain electrode,
   wherein the gate electrode overlaps the source electrode and the drain electrode through the gate insulator,
   wherein the drain electrode is connected to a pixel electrode,
   wherein the pixel electrode overlaps a capacitor electrode through an insulating layer,
   wherein the thin film transistors are arranged as a matrix-shaped using a plurality of gate wires connected to a plurality of the gate electrodes and a plurality of source wires connected to a plurality of the source electrodes,
   wherein the semiconductor layer is stripe-shaped and is parallel to the source wire in plane view and is extending over a plurality of the transistors connecting to one of the source wires,
   wherein the semiconductor layer is not formed above the source wire in the plane view
   and
   wherein the gate insulator being between a first group including the source wire, the source electrode, the drain electrode, the pixel electrode and the semiconductor layer, and a second group including the gate wire, the gate electrode, a capacitor wire and the capacitor electrode.

2. The thin film transistor array according to claim 1, wherein the semiconductor layer is an organic semiconductor.

3. The thin film transistor array according to claim 1, wherein the pixel electrode is not in contact with the semiconductor layer.

4. The thin film transistor array according to claim 1, wherein a portion where the drain electrode and the pixel electrode do not respectively overlap the gate electrode and the capacitor electrode is not in contact with the semiconductor layer.

5. The thin film transistor array according to claim 1, wherein the source electrode and the drain electrode are comb-teeth shaped electrodes.

6. The thin film transistor array according to claim 5, wherein the number of the teeth of the source electrode is more than the number of the teeth of the drain electrode.

7. The thin film transistor array according to claim 5, wherein the both outer teeth of the comb-teeth shaped source electrode at one transistor are next to the both outer teeth of the comb-teeth shaped source electrode at another transistor adjacent to the one transistor.

8. The thin film transistor array according to claim 7, wherein the both outer teeth of the comb-teeth shaped source electrode intersects the stripe-shaped semiconductor layer and the ends of the both outer teeth are put out of the stripe-shaped semiconductor layer.

9. The thin film transistor according to claim 1, wherein the insulating substrate is a flexible substrate.

10. A method for manufacturing the transistor array according to claim 1, comprising:
    forming the gate electrode;
    forming the gate insulator;
    forming the source electrode and the drain electrode;
    forming the pixel electrode; and
    forming the semiconductor layer,
    wherein at least one of the forming processes is a printing process.

11. The method for manufacturing the transistor array according to claim 10, wherein the forming the semiconductor layer is conducted by a relief printing process.

12. The method for manufacturing the transistor array according to claim 10, wherein at least one of forming the gate electrode, forming the source electrode and the drain electrode and forming the pixel electrode is conducted by a screen printing or a relief printing process.

13. An active matrix type display, comprising:
the thin film transistor array according to claim 1; and
an image display means.

14. The active matrix type display according to claim 13, wherein the image display means is an electrophoretic type display.

15. The active matrix type display according to claim 13, wherein the image display means is an organic electroluminescence display.

16. The active matrix type display according to claim 13, wherein the image display means is a liquid crystal display.

17. The active matrix type display according to claim 13, wherein the number of the semiconductor layer included in the thin film transistor array is equal to the number of the source wire included in the thin film transistor array.

\* \* \* \* \*